US009266738B2

(12) United States Patent
Haddon et al.

(10) Patent No.: US 9,266,738 B2
(45) Date of Patent: Feb. 23, 2016

(54) ORGANOMETALLIC CHEMISTRY OF EXTENDED PERIODIC Π-ELECTRON SYSTEMS

(75) Inventors: Robert C. Haddon, Riverside, CA (US); Santanu Sarkar, Riverside, CA (US); Sandip Niyogi, San Jose, CA (US); Elena Bekyarova, Riverside, CA (US); Mikhail E. Itkis, Riverside, CA (US); Xiaojuan Tian, Riverside, CA (US); Feihu Wang, Riverside, CA (US)

(73) Assignee: The Regents of the University of California, Oakland, CA (US)

(*) Notice: Subject to any disclaimer, the term of this patent is extended or adjusted under 35 U.S.C. 154(b) by 0 days.

(21) Appl. No.: 13/879,477

(22) PCT Filed: Oct. 14, 2011

(86) PCT No.: PCT/US2011/056471
§ 371 (c)(1),
(2), (4) Date: Apr. 15, 2013

(87) PCT Pub. No.: WO2012/051597
PCT Pub. Date: Apr. 19, 2012

(65) Prior Publication Data
US 2013/0202515 A1 Aug. 8, 2013

Related U.S. Application Data

(60) Provisional application No. 61/393,799, filed on Oct. 15, 2010.

(51) Int. Cl.
C01B 31/04 (2006.01)
C01B 31/02 (2006.01)
B82Y 10/00 (2011.01)
H01B 1/04 (2006.01)
H01L 29/16 (2006.01)
H01L 51/00 (2006.01)
B82Y 30/00 (2011.01)
B82Y 40/00 (2011.01)

(52) U.S. Cl.
CPC .............. *C01B 31/0484* (2013.01); *B82Y 10/00* (2013.01); *B82Y 30/00* (2013.01); *B82Y 40/00* (2013.01); *C01B 31/0273* (2013.01); *C01B 31/04* (2013.01); *C01B 31/0469* (2013.01); *H01B 1/04* (2013.01); *H01L 29/1606* (2013.01); *H01L 51/0049* (2013.01); *C01B 2202/02* (2013.01); *C01B 2202/04* (2013.01); *C01B 2202/06* (2013.01); *C01B 2204/02* (2013.01); *C01B 2204/04* (2013.01)

(58) Field of Classification Search
CPC ..... C07F 19/00; C01B 31/04; C01B 31/0484; C01B 31/125; C01B 31/0273; H01L 29/1606; H01L 51/0049; H01B 1/04
USPC ............ 556/43, 46, 52, 58, 136, 140; 534/15; 423/417, 440
See application file for complete search history.

(56) References Cited

U.S. PATENT DOCUMENTS

| 2001/0041160 A1 | 11/2001 | Margrave et al. |
| 2008/0019893 A1 | 1/2008 | Iijima et al. |
| 2010/0004468 A1 | 1/2010 | Wong et al. |
| 2010/0133465 A1 | 6/2010 | Kwon et al. |
| 2010/0255290 A1 | 10/2010 | Bai et al. |

OTHER PUBLICATIONS

International Preliminary Report on Patentability and Written Opinion dated Apr. 16, 2013 for corresponding PCT Application PCT/US2011/056471.

*Primary Examiner* — Porfirio Nazario Gonzalez
(74) *Attorney, Agent, or Firm* — Knobbe, Martens, Olson & Bear LLP

(57) ABSTRACT

A method of modifying a carbon material is disclosed. The method comprises: bonding a metal to a carbon material to form a metal-carbon complex comprising the metal and a benzene unit, wherein the carbon material comprises extended $sp^2$-bonded carbon atoms.

52 Claims, 23 Drawing Sheets

In Figure D: Cr* = Cr atoms below and Cr = above the graphene plane

ORGANOMETALLIC CHEMISTRY OF EXTENDED PERIODIC Π-ELECTRON SYSTEMS

CROSS-REFERENCE TO RELATED APPLICATION

This application is the U.S. National Phase of PCT/US2011/056471 and claims priority to U.S. Provisional Application No. 61/393,799, filed Oct. 15, 2010, the entire content of which is incorporated herein by reference.

BACKGROUND

Graphene is a two-dimensional lattice of carbon atoms and is the basic structural element of many carbon materials including graphite, charcoal, carbon nanotubes and fullerenes. Graphene-based electronic devices have significant potential for achieving high performance in the electronic and semiconductor industry because of their unique electronic properties, which are complemented by excellent mechanical and thermal properties.

However, in order to realize the potential of graphene as a superior electronic-material, there is a need to develop a method of chemically modifying graphene while minimizing disruption of its conjugated π-electron clouds, particularly its high π-electron cloud density and its relatively un-scattered motion, which contribute to the superior properties of graphene. One solution is to make a covalent modification, which just rearranges the π-electrons of graphene, does not create any $sp^3$ carbon centers at the reaction site and utilizes only the π-electrons derived from the conjugated graphene structure for filling the vacant metal orbitals.

Recent attempts to covalently modify graphene, in order to introduce a bandgap in its gapless semiconducting structure, have included either decoration of its macromolecular backbone with various organic functionalities (non-stoichiometric modification), such as the grafting of aryl groups to graphene, or making stoichiometric derivatives of graphene, namely graphane or fluorographene. However, these methods have involved the conversion of $sp^2$-hybridized carbon atoms to $sp^3$-hybridized configuration, leading to a serious disturbance and discontinuity in the conjugation of the π-electron clouds and thereby reducing the mobility of the carriers.

Moreover, pentahapto ($\eta^5$)- and hexahapto ($\eta^6$)-complexation was attempted but not achievable for fullerenes. In particular, the curvature in $C_{60}$ significantly inhibits the potential of the molecule to function as a ligand in pentahapto-($\eta^5$), and hexahapto-($\eta^6$) complexation reactions, because the fullerene π-orbitals are directed away from the metal as a result of the rehybridization of the ring carbon atoms. In $C_{60}$ the π-orbital axis vectors are directed away from the center of the respective rings and make angles of 16.3° (POAV2) to a normal to the plane of the five-membered rings and 25.8° (POAV2) to a normal to the plane of the six-membered rings. Thus, hexahapto-($\iota^6$) coordination is even more strongly disfavored than pentahapto-($\eta^5$) complexation. The organometallic chemistry of fullerene is dominated by dihapto ($\eta^2$)-complexation reactions.

Thus, methods and systems for providing for more effective and reversible covalent electronic modification of extended periodic π-electron carbon systems such as graphene, without disturbing the structural integrity of the $sp^2$ hybridized carbon atoms, are desirable.

SUMMARY

Embodiments of the present invention provide for a method of modifying a carbon material, the method comprising: bonding a metal to a carbon material to form a metal-carbon complex comprising the metal and a benzene unit, wherein the carbon material comprises extended $sp^2$-bonded carbon atoms. In one implementation, the metal is bonded to the carbon material by covalent hexahapto-bonding. In one implementation, the metal is bonded to the carbon material by hexahapto bonding or bis-hexahapto bonding.

The metal may be selected from the group consisting of scandium, yttrium, lanthanum, titanium, zirconium, hafnium, vanadium, niobium, tantalum, chromium, molybdenum, tungsten, manganese, technetium, rhenium, iron, ruthenium, osmium, praseodymium, neodymium, promethium, samarium, europium, gadolinium, terbium, dysprosium, holmium, erbium, thulium, ytterbium and lutetium.

In one implementation, the method is reversible such that the metal-carbon complex can be de-complexed by an oxidative de-complexation method.

The carbon material may be selected from the group consisting of graphite, exfoliated graphene, single-layer graphene, bi-layer graphene, multi-layer graphene, epitaxial graphene, CVD grown graphene, microcrystalline graphene, microcrystalline graphite, highly oriented pyrolytic graphite, single-walled carbon nanotubes, double-walled carbon nanotubes, multi-walled carbon nanotubes, microcrystalline synthetic graphite, carbon fibers, carbon whiskers, turbostatic graphite, activated graphite, glassy carbon and carbon black.

In one implementation, the carbon material is graphene, and the metal-carbon complex comprises at least one (graphene)-(metal atom)-(graphene) unit that electronically connects two-dimensional graphene sheets via the metal atom. In another implementation, the carbon material is a three-dimensional molecular wire, metal or superconductor, comprising two-dimensional graphene units that are electronically connected via an atom of the metal. In one implementation, the metal-carbon complex functions as an electronically conjugated reusable catalyst support.

In one implementation, the method of modifying the carbon material further comprises a solution-phase, a solid-phase or a gas phase cross-linking method. In one implementation, the metal may be covalently bonded to the carbon material by metal vapor synthesis. In another implementation, the metal may be covalently bonded to the carbon by room temperature complexation reactions of carbon to various metal carbonyls, where the metal carbonyl is $M(CO)_3L_3$, wherein L is a ligand that is weaker than a CO ligand. The ligand may be selected from a group consisting of acetonitrile ($CH_3CN$), ammonia ($NH_3$), primary amine ($RNH_2$, where "R" could be any alkyl or aryl group).

In one implementation, at least one reagent comprises a metal hexacarbonyl [$M(CO)_6$, wherein M is the metal], in presence of a foreign arene ligand, whereing the arene comprises naphthalene or a derivative of naphthalene.

A de-complexation method according to an embodiment comprises adding the modified carbon material including the metal-carbon complex to a solvent. In one implementation, the de-complexation method comprises exposing the carbon material and solvent to white light and air, or heating the metal-carbon complex in an electron-rich arene, wherein the carbon materials are returned to their unmodified state after the exposing or heating step. In one implementation, the solvent for the de-complexation method is selected from the group consisting of acetontrile, acetone and diethylether. In one implementation, de-complexation method comprises competitive arene substitution reactions by an electron-rich aromatic ligand. The electron-rich ligand may be selected from the group consisting benzene, toluene, mesitylene, hexamethylbenzene or a derivative of benzene. In one implementation, the de-complexation method further comprises use of iron, cerium or iodine as an oxidizing agent.

According to an embodiment, bonding the metal to the carbon material further comprises intercalating metals by electron-beam deposition.

According to an embodiment, modifying the carbon materials comprises increasing the dimension of the electronic structure of the carbon material. In one implementation, the carbon material is a one-dimensional material and modifying the carbon material comprises converting the one-dimensional material to a two-dimensional material or a three-dimensional material. In another implementation, the carbon material is a two-dimensional material and modifying the carbon material comprises converting the two-dimensional material to a three-dimensional material.

According to an embodiment, the metal is a Group 5 transition metal and modifying the carbon material comprises forming an (arene)$_2$M or [(arene)M]$_x$, wherein M is V, Nb or Ta, wherein x≥1, and wherein bonding with the Group 5 transition metal causes the carbon-metal complex to be p-doped. The arene may be a benzenoid carbon material.

According to another embodiment, the metal is a Group 6 transition metal, and modifying the carbon material comprises forming a substantially neutral (arene)$_2$M or [(arene) M]$_x$, wherein M is Cr, Mo or W, x≥1, and wherein bonding with the Group 6 metal causes no charge transfer interactions. The arene may be a benzenoid carbon material.

According to another embodiment, the metal is a Group 7 transition metal, and modifying the carbon material comprises forming an (arene)$_2$M or [(arene)M]$_x$, wherein M is Mn, Tc or Re, x≥1, and wherein bonding with the Group 7 metal causes the carbon-metal complex to be n-doped. The arene may be a benzenoid carbon material.

According to an embodiment, a method of functionalizing a carbon material comprises: providing a suspension of the carbon material (CM) in a solvent; and adding a metal carbonyl or a metal arene to the carbon suspension to form an organometallic complex, wherein the organometallic complex is selected from the group consisting of (CM)M(CO)$_3$, (CM)M(arene), (CM)M(CM), (arene)[M(CM)]$_n$(arene), [(CM)M]$_n$(CM), where n is an integer ≥1 and M is a metal. The arene may be an aromatic ligand, comprising a benzene or a derivative of benzene.

The metal may be prepared from a source selected from the group consisting of titanium(0) heptacarbonyl [Ti(CO)$_7$], vanadium(0) hexacarbonyl [V(CO)$_6$], chromium(0) hexacarbonyl [Cr(CO)$_6$], molybdenum(0) hexacarbonyl [Mo(CO)$_6$], tungsten(0) hexacarbonyl [W(CO)$_6$], dimanganese(0) decacarbonyl [Mn$_2$(CO)$_{10}$], ditechnetium(0) decacarbonyl [Tc$_2$(CO)$_{10}$], dirhenium(0) decacarbonyl [Re$_2$(CO)$_{10}$], iron(0) pentacarbonyls [Fe(CO)$_5$], ruthenium(0) pentacarbonyls [Ru(CO)$_5$], osmium(0) pentacarbonyls [Os(CO)$_5$], [Co$_2$(CO)$_8$], [Co$_4$(CO)$_{12}$], tetrarhodium dodecacarbonyl [Rh$_4$(CO)$_{12}$], hexadecacarbonyl hexarhodium [Rh$_6$(CO)$_{16}$], [Ir$_4$(CO)$_{12}$], and nickel(0) tetracarbonyl [Ni(CO)$_4$].

The metal carbonyl may be selected from the group consisting of metal hexacarbonyl, M(CO)$_6$, (arene)metal tricarbonyl, (arene)M(CO)$_3$, bis(arene)metal, (arene)$_2$M, M(CO)$_3$L$_3$, wherein L is any non-carbonyl ligand weaker than carbonyl, wherein L comprises CH$_3$CN, NH$_3$ or RNH$_2$, wherein R is any alkyl or aryl group, and wherein the arene is benzene or a derivative of benzene, naphthalene or a derivative of naphthalene.

In one implementation, the carbon material comprises graphite, and the solvent is selected from the group consisting of N,N-dimethylformamide (DMF), N-methylpyrrolidone (NMP), benzene, toluene, p-xylene, mono-chlorobenzene, ortho-dichlorobenzene, mono-fulorobenzene, benzylamine, a derivative of benzylamine, N-methylbenzylamine, N,N-dimetrhylbenzylamine, a perfluorinated aromatic solvent, octafluorotoluene, 1-butyl-3-methylimidazolium bis(trifluoromethane-sulfonyl)imide), tetrahydrofuran, dibutylether and any combination thereof. In one implementation, the solvent comprises an aromatic solvent capable of causing π-π stacking with graphene and of achieving concentration of graphene in solution ranging from 0.01 to 0.95 mg/mL. In another implementation, the solvent comprises 1-butyl-3-methylimidazolium bis(trifluoro-methane-sulfonyl)imide. In another implementation, the solvent comprises an electron-deficient aromatic ligand. In another implementation, the solvent comprises a perfluorinated aromatic solvent. In another implementation, the solvent comprises ortho-dichlorobenzene (ODCB), and wherein the ODCB polymerizes during ultrasonication and increases π-π stacking interaction between sheets of graphene.

In one implementation, a method of functionalizing a carbon material comprises preparing a stable solution from the suspension by ultrasonication and centrifugation, wherein the carbon material is graphene. In one implementation, the functionalized carbon material has a stoichiometry of MC$_x$, wherein M is the metal, C is carbon, and x is any number greater than or equal to zero.

According to an embodiment, a carbon-based material comprises: a metal covalently bonded to carbon, wherein the metal binds two benzene units, wherein the carbon material comprises extended sp$^2$-bonded carbon atoms. In one implementation, the metal is bonded to the carbon material by hexahapto bonding or bis-hexahapto bonding. In one implementation, the carbon-based material comprises carbon nanotubes having a different ratio of semiconducting to metallic single-walled nanotubes and multi-wall nanotubes. In one implementation, the carbon-based material comprises conductive bridges that are formed between single-walled nanotubes by intercalating metal atoms.

In one implementation, the carbon-based material comprises a carbon-metal complex that has 18 electrons in the valence shell. In one implementation, the carbon-based material comprises a carbon-metal complex, with an electronic charge distribution of (arene)M$^{-1}$(arene$^{+1}$), or [(arene$^{+1}$)M$^{-1}$]$_x$, wherein M is V, Nb or Ta, x≥1, wherein the arene is p-doped, and wherein the arene is a benzenoid carbon material. In one implementation, the carbon-based material comprises a carbon-metal complex, with an electronic charge distribution of (arene)M$^{+1}$(arene$^{-1}$) or [(arene$^{-1}$)M$^{+1}$]$_x$, whereing M=Mn, Tc or Re, x≥1, wherein the arene is n-doped, and wherein the arene is a benzenoid carbon material. In one implementation, the carbon-based material comprises adjacent conductive planes of sp$^2$-bonded carbon atoms, wherein the metal functions as a conductive interconnect between the adjacent conductive planes.

According to an embodiment, an electronic device comprises the carbon-based material as set forth above. In one implementation, the carbon-based material is an interconnect of a transistor. In one implementation, the carbon-based material is a ferromagnetic semiconductor. In one implementation, the carbon-based material is a superconductor. In one implementation, the carbon-based material comprises adjacent conductive planes of sp$^2$-bonded carbon atoms, and wherein the metal functions as a conductive interconnect between the adjacent conductive planes.

BRIEF DESCRIPTION OF THE DRAWINGS

The above and other features and advantages of the present invention will become more evident by describing in more detail various embodiments in which.

DETAILED DESCRIPTION

Figure 1:
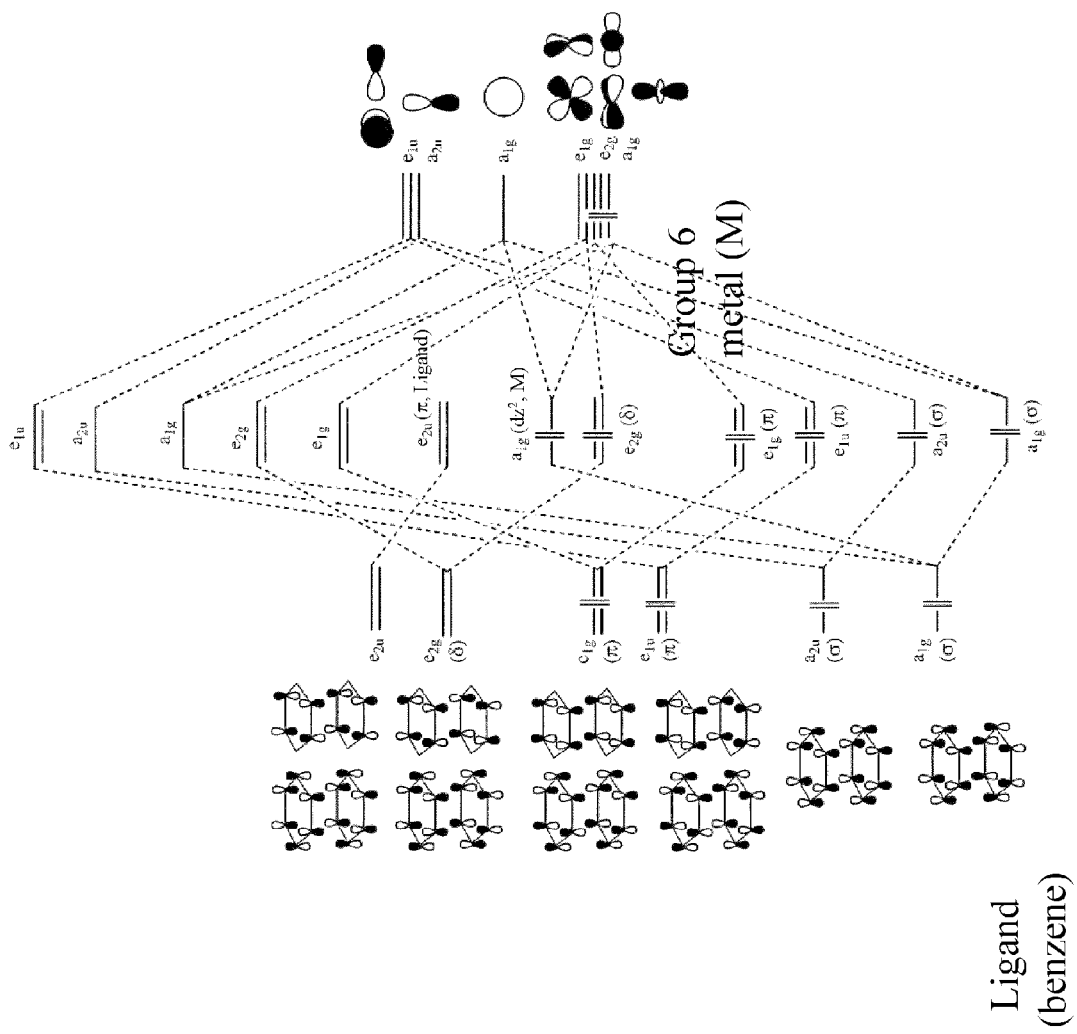
FIG. 1 shows a generic molecular orbital energy correlation diagram between a $d^6$ transition metal (M) and a pair of benzenoid 6 pi-electron ligands showing the most important orbitals involved in a hexahapto bond of the form ($\eta^6$-benzene)$_2$M.

Embodiments of the present invention provide simple, efficient and reproducible methods for hexahapto ($\eta^6$) complexation of various carbon materials particularly having periodic extended sp$^2$-bonded carbon atoms (such as graphene, graphite and carbon nanotubes) with transition metals, for example, Group 6 metals, and reversible metal-graphene systems. The reversible covalent metal functionalization according to embodiments of the invention offer novel methods of controlled chemical engineering of the band structure and transport properties of these extended periodic $\pi$-electron systems, providing a versatile platform of reversible grafting of metal to carbon materials via $\eta^6$ complexation. Various embodiments of carbon-metal hexahapto coordination environments are described herein, although the descriptions of the hexahapto organometallic complexes are in no way intended to limit the applicability of the systems and methods of the present invention to other types of metal-based coordination environments.

The existing art of chemical functionalization of graphene involves conversion of sp$^2$-hybridized carbon atoms to sp$^3$-hybridized carbon atoms, resulting in undesirable and significant perturbation to the sp$^2$ coordination of carbon atoms in graphene's regular honeycomb lattice, namely to the high density of $\pi$ electrons and their relatively un-scattered motion, which in turn, affects the superior properties of carbon materials such as graphene. Embodiments of the invention involve hexahapto organometallic complexation reactions, which allow vacant metal orbitals to be hybridized with the occupied $\pi$-orbitals of extended periodic $\pi$-electron systems, resulting in coordination of the metal atom to individual benzenoid aromatic rings in carbon materials such as graphene. Thus, in embodiments of the invention, the metal complexation of carbon materials with extended sp$^2$ configuration is not expected to significantly rehybridize the sp$^2$ carbon atoms, in contrast to prior art methods that change the hybridization state of the carbon atoms from sp$^2$ to sp$^3$, and effectively remove a carbon atom from conjugation.

Embodiments of the invention provide for modification and control of the electronic structure of extended benzenoid periodic $\pi$-electron systems present in many carbon materials, including but not limited to graphene, graphite, carbon nanotubes (CNTs), specifically, single-walled carbon nanotubes (SWNTs), double-walled carbon nanotubes (DWNTs), and multi-walled carbon nanotubes (MWNT). In particular, embodiments of the invention provide for hexahapto($\eta^6$)-complexation of the conjugated six-membered carbon rings by metal atoms (M), so as to form ($\eta^6$-benzenoid)$_2$M bonds in which the metal atoms bridge the two superimposed periodic $\pi$-electron systems by hexahapto coordination to a benzene ring in each of the two component systems.

Embodiments of the invention provide for new carbon-based materials, based on the novel use of carbon materials with extended periodic $\pi$-electron systems as a two-dimensional primary ligand. For example, the hexahapto ($\eta^6$) organometallic coordination to incipient benzene rings may be a means to electronically connect individual extended benzenoid periodic $\pi$-electron sub-units such as: (1) SWNT-SWNT interconnects, either in bundles or between individual SWNTs, (2) MWNT-MWNT interconnects, either in bundles or between individual MWNTs, (3) Graphene-Graphene sheets, and (4) all possible combinations of (1)-(3). According to another embodiment, the hexahapto($\eta^6$)-complex also provides an interconnect between dissimilar units, for example, between a SWNT and MWNT, or a CNT and a graphene sheet.

Specifically, the hexahapto-coordinated mode of bonding provides for an increase in the dimension of a carbon material, such as the conversion of one-dimensional carbon materials (e.g., CNTs), into two- and three-dimensional structures and solids, and likewise the conversion of two-dimensional carbon materials, such as graphene and graphite, into multilayer three-dimensional structures and solids. For example, one embodiment of the invention provides for the bulk complexation of Cr, Mo, W in the galleries between graphene layers in graphite, which involve ($\eta^6$-graphene)$_2$[Cr, Mo, W] bonding, and results in the conversion of the two-dimensional electronic structure of graphite into a three-dimensional metal and superconductor. Another embodiment of the invention provides for the bulk complexation of Cr, Mo, W in the galleries between CNTs to give ($\eta^6$-SWNT)$_2$[Cr, Mo, W] and ($\eta^6$-MWNT)$_2$[Cr, Mo, W] bonds, and results in the conversion of the one-dimensional CNTs into two-dimensional and three-dimensional materials. While structurally similar to the standard intercalation compounds of graphite and CNTs, the electronic structure of the present compounds is entirely distinct as it does not involve a high degree of charge transfer, and may be described as covalent rather than ionic. Thus, the present compounds cannot be prepared by the simple charge transfer intercalation procedures that are conventionally employed, particularly in the case of the reaction with graphite.

The metals used in the hexahapto complexation reaction according to embodiments of the invention include, but are not limited to Group 6 transition metals, such as chromium (Cr), molybdenum (Mo), tungsten (W), which are expected to exert minimal perturbation of the structural integrity of the sp$^2$ hybridized carbon atoms in these extended periodic π-electron systems, while functioning as an efficient means of electronic interconnect. Thus, the use of the Group 6 metals can generate 2-D and 3-D interconnected carbon structures and solids, with bonds having the form ($\eta^6$-arene)$_2$[Cr, Mo, W], wherein the arene is any benzenoid ring in an extended periodic π-electron systems such as in graphene, graphite and carbon nanotubes. Group 6 compounds are specifically designed to maintain the 18-electron count around the transition metal and to produce covalent bonds in which the arene and metal are close to neutral (FIG. 1), but it will be advantageous in certain circumstances to vary the electron count around the metal and thus produce organometallic compounds of CNT, graphene and graphite, in which the bond to the metal is not only covalent but also introduces ionic character. This will allow the synthesis of compounds with all of the advantages of increased dimensionality discussed above but also with a degree of doping or non-stoichiometry in the electron count on the metal and on the CNT, graphene or graphite ligand.

Embodiments of the invention also provide the advantage of allowing for the doping of carbon materials without the need for additional external dopants. For example, according to embodiments, Group 5 metals (V, Nb, Ta) may be used as the metal in the hexahapto ($\eta^6$) complexation reaction. The use of Group 5 metals will allow the formation of structures and solids in which there are only 17 electrons in the valence shell of the metal. In these compounds, there will be an electron missing from the highest occupied molecular orbital (HOMO) of the 18 electron Group 6 electronic configuration (FIG. 1). The HOMO in ($\eta^6$-benzene)$_2$Cr is the $a_{1g}$ orbital which is primarily derived from the metal based $d_{z^2}$ orbital (FIG. 1), and thus this orbital will only be half-filled in the Group 5 metal complexes. Because graphene is an excellent electron donor, in some situations there will be charge transfer from the CNT or graphene sheet to the metal resulting in p-type doping of the CNT or graphene (which may lead to photoconductivity).

According to other embodiments, Group 7 metals (Mn, Tc, Re) may be used as the metal in the hexahapto ($\eta^6$) complexation reaction. The converse situation to Group 5 metals may occur with the Group 7 metals, specifically, in their 19 electron systems with an extra electron filling the lowest unoccupied molecular orbital (LUMO). For ($\eta^6$-benzene)$_2$Cr in particular, the LUMO is the degenerate $e_{2u}$ orbital which is primarily ligand (benzene)-based (there is also a low lying degenerate $e_{2g}$ set of ligand orbitals) (FIG. 1), and thus the extra electron is expected to reside primarily on the attached CNT or graphene which will become n-type doped.

According to embodiments, metals from Group 4, 8 and 9 may also be used for purposes of doping the carbon material p-type or n-type, without the need for an additional dopant. Thus, embodiments of the invention provide for the additional advantages of control in doping and the electron count in carbon-based materials with extended periodic π-electron systems. This makes it possible to optimize the transport properties in these extended periodic π-electron carbon systems to generate materials of any electronic structure, from semiconductors to metals and superconductors.

According to embodiments, a Group 4 transition metal may be prepared from the source of titanium(0) heptacarbonyl [Ti(CO)$_7$], a Group 5 metal may be prepared from the source of vanadium(0) hexacarbonyl [V(CO)$_6$], Group 6 metal may be prepared from sources chromium(0) hexacarbonyl [Cr(CO)$_6$], molybdenum(0) hexacarbonyl [Mo(CO)$_6$], tungsten(0) hexacarbonyl [W(CO)$_6$], a Group 7 metal may be prepared from sources dimanganese(0) decacarbonyl [Mn$_2$(CO)$_{10}$], ditechnetium(0) decacarbonyl [Tc$_2$(CO)$_{10}$], dirhenium(0) decacarbonyl [Re$_2$(CO)$_{10}$], a Group 8 metal may be prepared from sources iron(0) pentacarbonyls [Fe(CO)$_5$], ruthenium(0) pentacarbonyls [Ru(CO)$_5$], osmium(0) pentacarbonyls [Os(CO)$_5$], a Group 9 metal may be prepared from sources [Co$_2$(CO)$_8$], [Co$_4$(CO)$_{12}$], tetrarhodium dodecacarbonyl [Rh$_4$(CO)$_{12}$], hexadecacarbonyl hexarhodium [Rh$_6$(CO)$_{16}$], [Ir$_4$(CO)$_{12}$], and a Group 10 metal may be prepared from the source of nickel(0) tetracarbonyl [Ni(CO)$_4$].

According to embodiments of the invention, the hexahapto ($\eta^6$) complexation of the benzenoid rings is reversible. For example, according to an embodiment, the graphene configured with hexahapto ($\eta^6$) complexation to chromium is de-complexed to its original pristine graphene state by exposure to white light in a solution of acetonitrile, as further discussed below. The reversibility of the metal functionalization of the carbon materials provides controlled chemical engineering of the band structure and transport properties of carbon materials with extended periodic π-electron systems in a simple, reproducible and efficient manner.

According to embodiments of the invention, the bond between the metal and benzene unit in the hexahapto-complexed benzene rings is covalent. In contrast, in conventional systems, for example, based on the intercalation of certain metals in graphitic sheets, the bond between the metal and carbon is ionic. According to embodiments of the invention, the covalent bond distance between the metal and benzene unit has been shown to be smaller than the ionic bond distance between the metal and benzene unit reported in conventional graphite intercalation systems, in which more distance between adjacent sheets of graphite had formed to accommodate the metal atom.

Moreover, as further discussed below, measurement of transport properties suggest that functionalization of only the top layer of extended periodic π-electron carbon systems affects the bulk transport properties over larger distances. This would suggest pronounced changes to the electronic structure and transport properties of the carbon from near-metallic to semiconducting.

Organometallic complexes of graphene according to embodiments of the present invention are not limited to solution chemistry, but are also applicable to gas phase reaction chemistry, which would provide for metal grafting process that are more attractive by being less expensive, particularly because gas phase reactions avoid the use of solvents, which are expensive, generally hazardous, and often require expensive disposal procedures.

The following examples illustrate embodiments of the invention, but should not be viewed as limiting the scope of the invention.

Preparation of Hexahapto Complexes of Carbon Materials

Example 1

Solution Phase Synthesis of Graphene-Metal (Graphene-Chromium) Complexes

Figure 2:
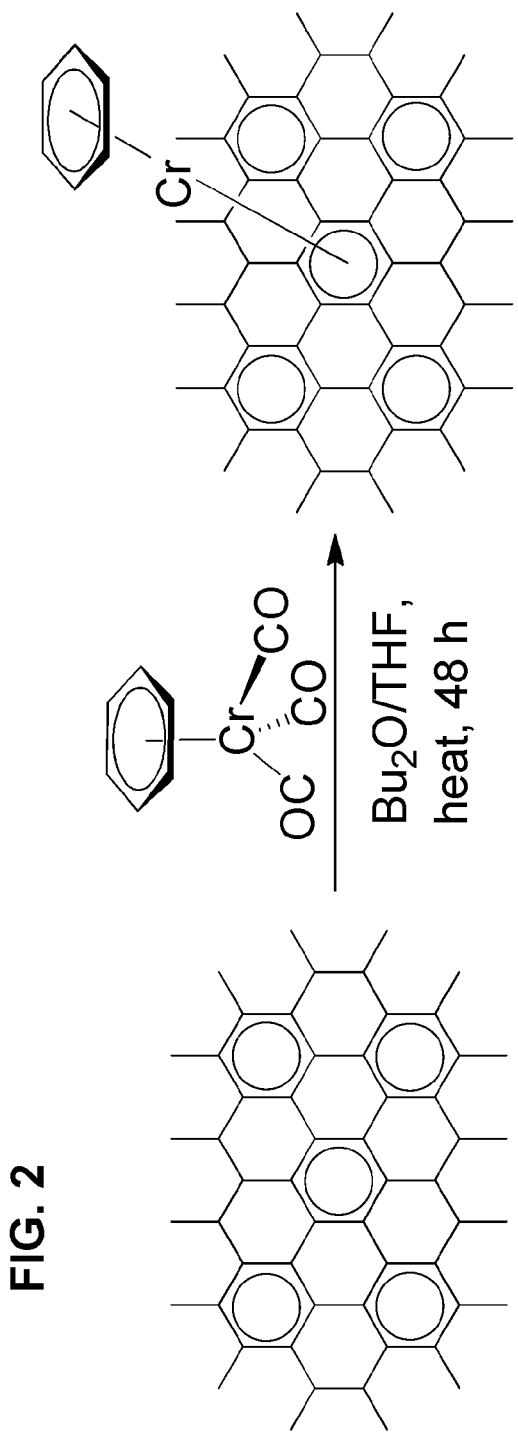
FIG. 2 shows a schematic of the hexahapto complexation of graphene with a chromium reagent, ($\eta^6$-benzene)Cr(CO)$_3$ to form a stable 18 electron complex, ($\eta^6$-graphene)Cr($\eta^6$-benzene) [effective atomic number, EAN=36]

The $\eta^6$ complexation of graphene with ($\eta^6$-benzene)chromium(0) tricarbonyl is illustrated in FIG. 2. In the present example, ($\eta^6$-benzene)Cr(CO)$_3$ (36 mg, 0.168 mmol, FW=214.4) was added to a suspension of exfoliated graphene (20 mg, 1.67 mmol of carbons) in THF (4 mL). The reaction mixture was stirred vigorously and refluxed at 130° C. in argon flow and absence of light for 48 hours. The resulting mixture was filtered using 0.2 μm PTFE filter paper and the solid was washed with fresh THF and ether, to remove excess chromium reagent, if any. The resulting solid was dried under high vacuum overnight in the dark to obtain a silver-colored solid (~27 mg of solid was isolated). The amount of chromium reagent added can be varied, as to allow for control of metal loading to graphene and allow for the formation of a wide range of oligomeric polynuclear [graphene-chromium]$_n$(benzene)complexes of various stoichiometries.

Figure 3:
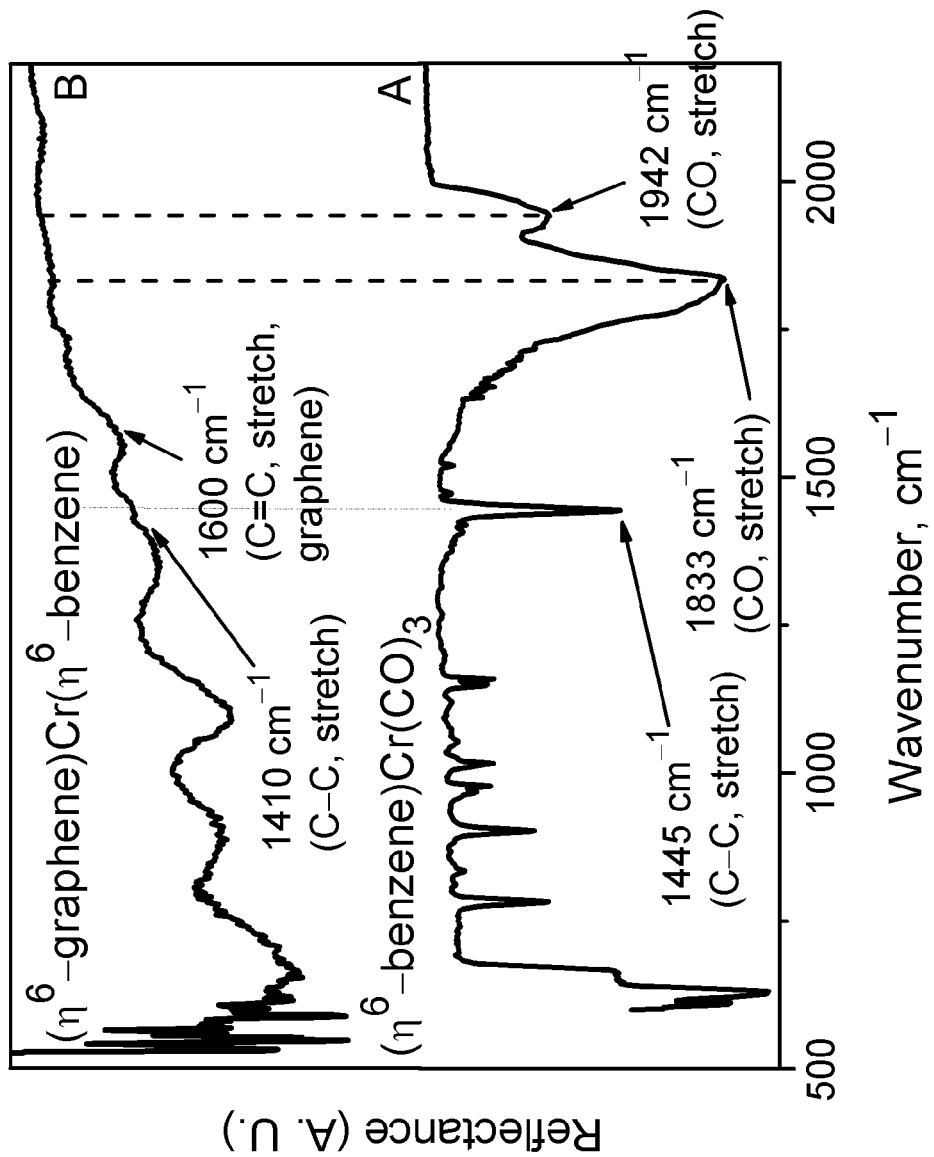
FIG. 3 shows an ATR spectra of (A) ($\eta^6$-graphene)Cr(CO)$_3$ and (B) ($\eta^6$-graphene)Cr($\eta^6$-graphene)

The formation of the ($\eta^6$-graphene)Cr(Benzene) complex was confirmed by the absence of the strong peaks corresponding to the carbonyl (CO) stretching frequencies of the FT-IR spectra of the graphene-chromium complex (FIG. 3).

Figure 4:
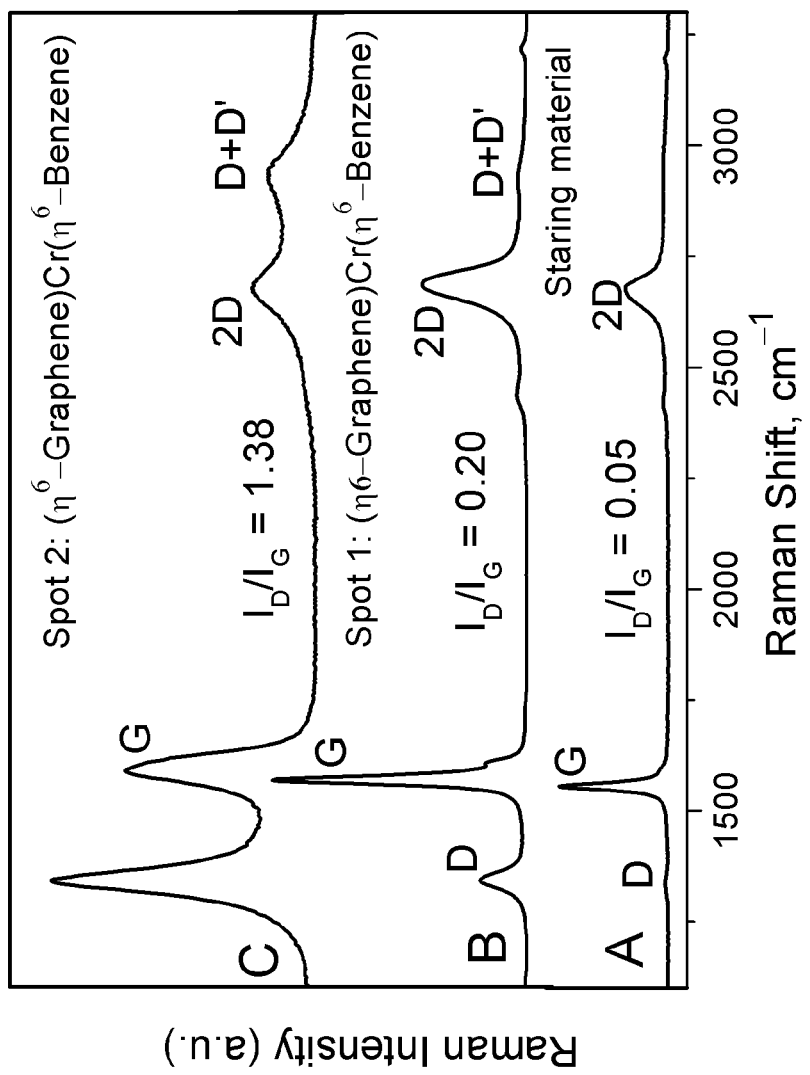
FIG. 4 shows a Raman spectra of the product, ($\eta^6$-graphene)Cr($\eta^6$-benzene) [solid sample on a SiO$_2$ substrate, $\lambda$ex=532 nm] formed in FIG. 2. Spectrum 3A is the Raman spectra of the starting material, exfoliated graphene. Spectra 3B and 3C are spectra of the product.

In addition, pronounced changes were observed in the Raman spectrum of graphene resulting from the hexahapto complexation of graphene with chromium, as shown in FIGS. 4B and 4C. Upon functionalization of graphene with chromium, a prominent D peak appears at ~1340 cm$^{-1}$ and the G peak (at ~1590 cm$^{-1}$) is shifted to higher energies.

Example 2

The hexahapto complexation of graphene with chromium hexacarbonyl [Cr(CO)$_6$] resulted in the formation of either ($\eta^6$-graphene)$_2$Cr or ($\eta^6$-graphene)Cr(CO)$_3$ structure, depending on the amount of metal loading in the graphene structures (i.e., by controlling the number of equivalents of chromium hexacarbonyl added). The former structure ($\eta^6$-graphene)$_2$Cr, in which the metal atom resides between two planar two-dimensional (2-D) graphene sheets, adopted a "sandwich-type" geometry, while the latter structure [($\eta^6$-graphene)Cr(CO)$_3$] adopted an inverted 'stool' structure, for example, with three CO legs and a 2D graphene ligand as its base.

In the present example, chromium(0) hexacarbonyl (8.2 mg, 0.04 mmol, 1 equivalent, FW=220.06) was added to a suspension of exfoliated graphene (20 mg, 1.67 mmol, 0.02 equivalents) in dibutyl ether (6 mL) and THF (2 mL). The black suspension was stirred vigorously and refluxed at 130° C. in the absence of light under an atmosphere of argon for 48 hours. The reaction mixture was filtered using 0.2 μm PTFE filter paper, and the solid was washed with fresh THF and ether. The resulting solid (~19 mg) was dried under vacuum overnight in the dark.

Figure 5:
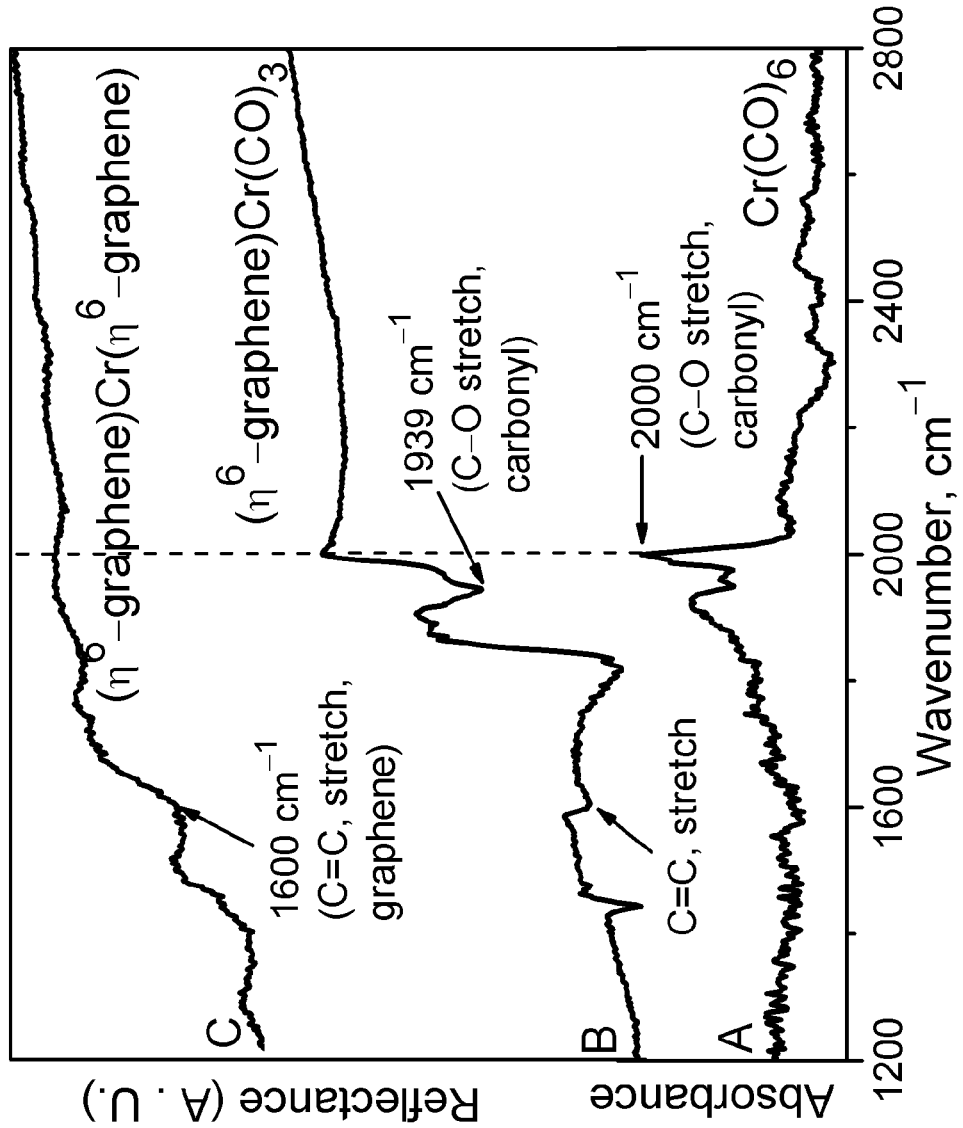
FIG. 5 shows an FT-IR spectra (ATR, Ge) of A- Cr(CO)$_6$, B- ($\eta^6$-graphene)Cr(CO)$_3$ and C- ($\eta^6$-graphene)Cr($\eta^6$-graphene)

The determination that the complex formed was ($\eta^6$-graphene)$_2$Cr, rather than ($\eta^6$-graphene)Cr(CO)$_3$, is made on the basis of the absence of any strong peaks corresponding to the carbonyl (CO) stretching frequencies of the FT-IR spectra of the exfoliated graphene-chromium complex (FIG. 5C).

The ($\eta^6$-graphene)Cr(CO)$_3$ structures can be synthesized in a similar manner, but using 0.13 equivalents of Cr(CO)$_6$ reagent with respect to carbon atoms of graphene. The resulting complex shows C—O stretching vibration at 1939 cm$^{-1}$, compared to at 2000 cm$^{-1}$ in case of the starting Cr(CO)$_6$ (FIG. 5B).

Example 3

Synthesis of Graphite-Chromium Complexes, ($\eta^6$-HOPG)Cr(CO)$_3$

Figure 6:
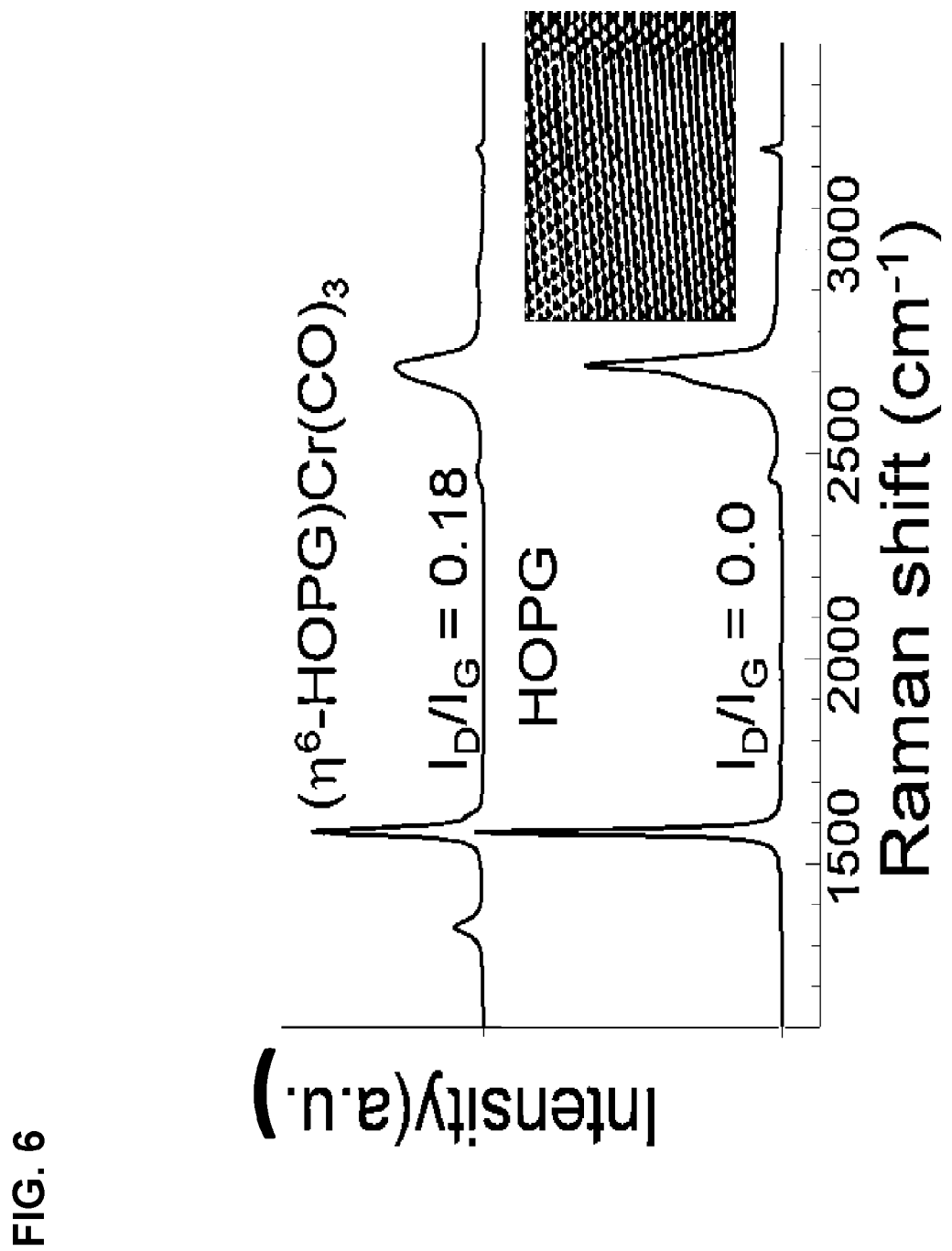
FIG. 6 shows a Raman spectra of ($\eta^6$-HOPG)Cr(CO)$_3$ and pristine HOPG; the inset shows a 5×3.5 nm STM image of HOPG collected under ambient conditions, Vs=+5 mV, It=2 nA.
Figure 7:
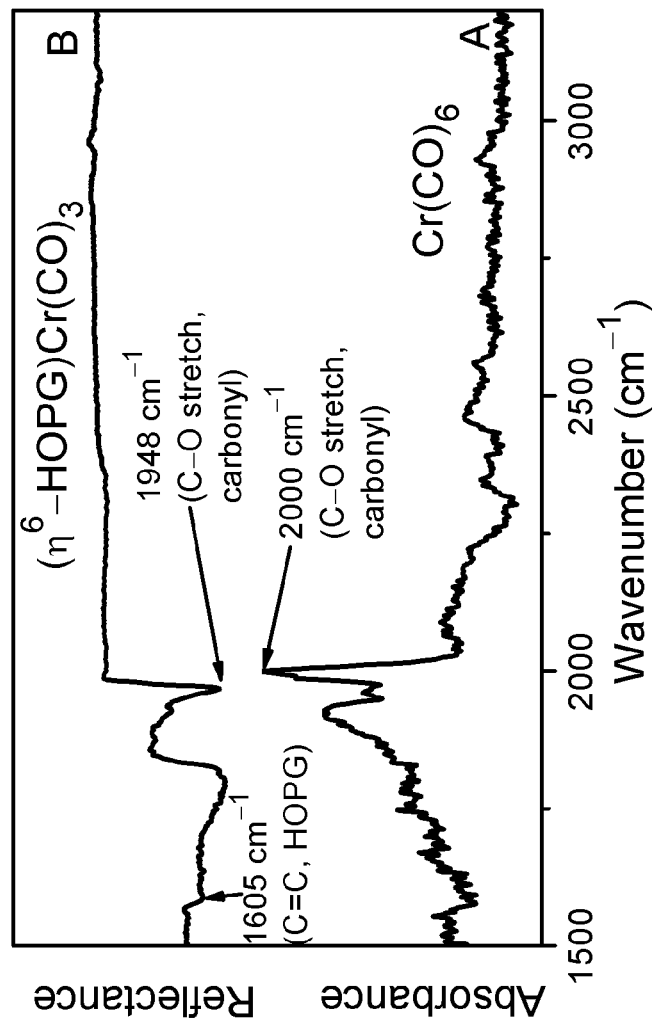
FIG. 7 shows a FT-IR spectra (ATR, Ge) of (A) Cr(CO)$_6$ and (B) ($\eta^6$-HOPG)Cr(CO)$_3$.

The chromium complexes of highly oriented pyrolytic graphite (HOPG) were made as follows. In order to explore the surface chemistry of HOPG and synthesize the non-cross linked complex ($\eta^6$-HOPG)Cr(CO)$_3$, HOPG (~0.28 cm$^2$) was heated in a solution of Cr(CO)$_6$ (30 mg, 0.136 mmol) in dibutyl ether (3 mL) and THF (1 mL) under a positive pressure of argon at 130° C. for 48 hours without stirring, after which it was washed with anhydrous ether. The resulting complex, ($\eta^6$-HOPG)Cr(CO)$_3$ was dried under a gentle flow of argon. FIG. 6 illustrates the Raman spectra ($\lambda_{ex}$=532 nm, spot size 0.7 μm) of the complex. The FT-IR reflectance spectra of the complex show the characteristic carbonyl C—O stretching frequency at 1948 cm$^{-1}$ (FIG. 7); whereas the same C—O stretching frequency for the carbonyl ligand in the reagent, Cr(CO)$_6$ was observed at 2000 cm$^{-1}$, confirming the formation of the ($\eta^6$-HOPG)Cr(CO)$_3$ complex.

Example 4

Synthesis of the Graphite-Chromium Complex ($\eta^6$-HOPG)Cr($\eta^6$-Benzene)

Figure 8:
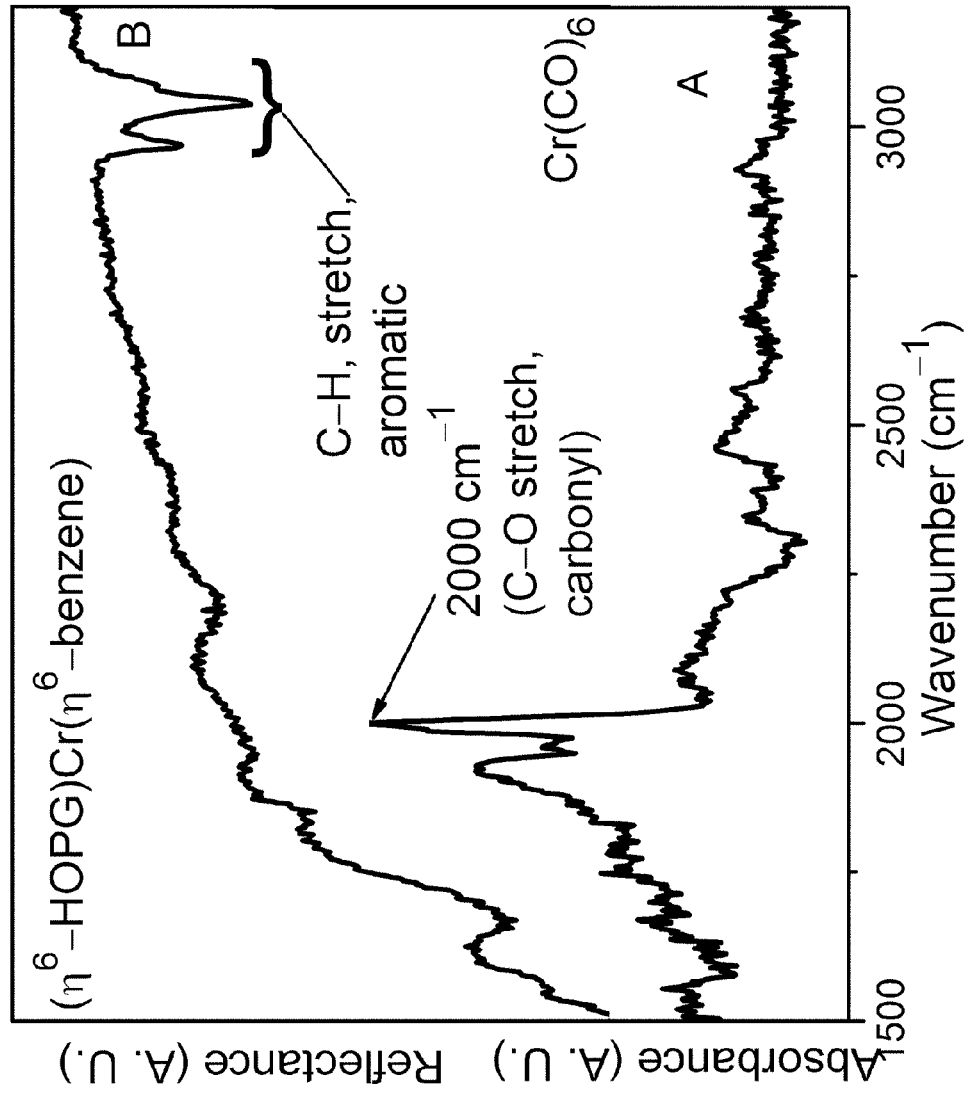
FIG. 8 shows a FT-IR spectra (ATR, Ge) of (A) Cr(CO)6, (B) ($\eta^6$-HOPG)Cr($\eta^6$-benzene)

A piece of HOPG (~0.32 cm$^2$) was heated in a solution of ($\eta^6$-benzene)Cr(CO)$_3$ (33 mg, 0.155 mmol) in THF (3 mL) under a positive pressure of argon at 72° C. for 72 hours without stirring, after which it was washed with THF and anhydrous ether. The resulting complex, ($\eta^6$-HOPG)Cr($\eta^6$-Benzene) was dried under a gentle flow of argon. The FT-IR spectrum of ($\eta^6$-HOPG)Cr($\eta^6$-Benzene) in FIG. 8 did not show C—O stretching vibrations, which confirms that the structure included benzene, rather than CO ligand.

Example 5

Synthesis of the Graphene-Chromium, ($\eta^6$-EG)Cr(CO)$_3$ Structures (EG=Epitaxial Graphene)

Figure 9:
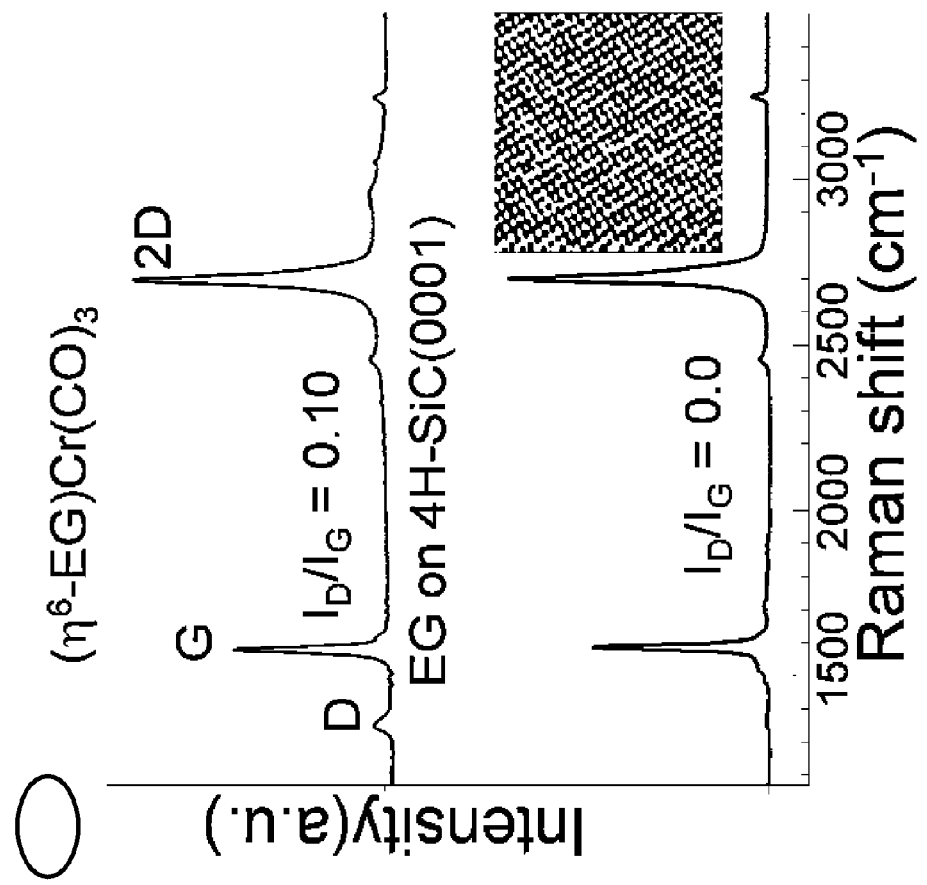
FIG. 9 shows a Raman spectra of epitaxial graphene on SiC (EG) and ($\eta^6$-EG)Cr(CO)$_3$; the inset shows a 5×5 nm STM image of epitaxial graphene, Vs=+8 mV, It=1 nA.

Epitaxial graphene grown on SiC was exposed to a solution of Cr(CO)$_6$ (30 mg, 0.136 mmol) in dry, freshly distilled THF (3 mL) and degassed dibutyl ether (1 mL) in the absence of light, and the solution was heated at 72° C. under a positive pressure of argon for 20 hours without stirring, after which it was washed with THF and anhydrous ether. The ($\eta^6$-EG)Cr (CO)$_3$ complex, thus obtained, was dried under a gentle flow of argon. FIG. 9 compares the Raman spectra of the epitaxial graphene before reaction ($I_D/I_G$=0.0) and after complexation with the chromium carbonyl reagent ($I_D/I_G$=0.10, top spectra).

Example 6

Figure 10:
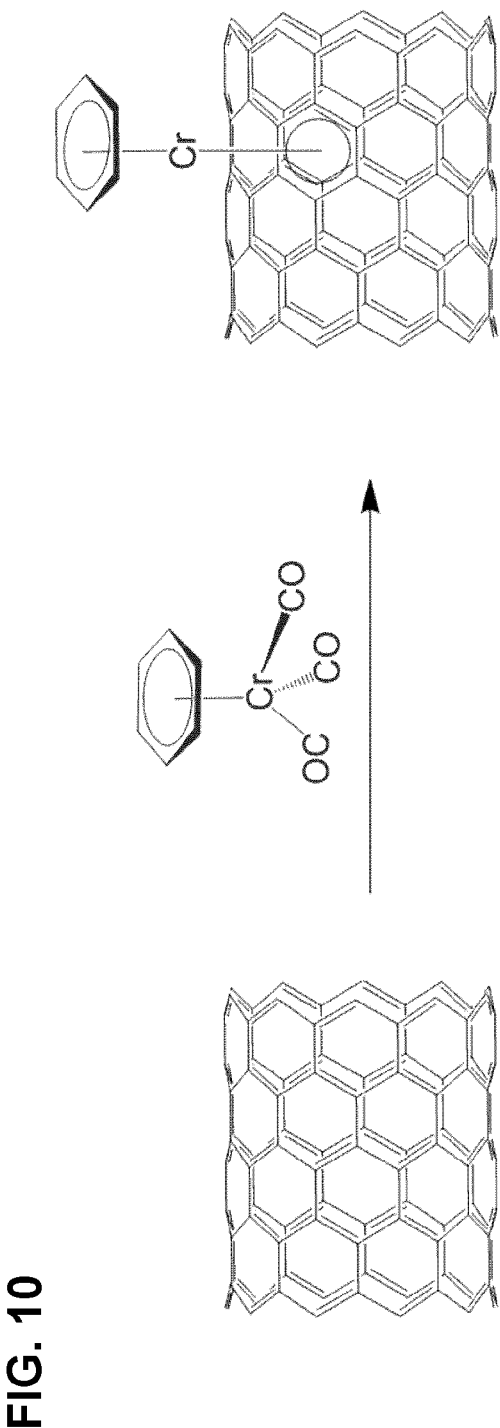
FIG. 10 shows schematics of the $\eta^6$-complexation of single-walled carbon nanotubes (SWNTs) with ($\eta^6$-benzene)Cr(CO)$_3$ to form a SWNT-chromium complex.

The SWNT-chromium complex, ($\eta^6$-SWNT)Cr($\eta^6$-benzene) was prepared as follows: ($\eta^6$-benzene)chromium(0) tricarbonyl (17 mg, 0.08 mmol, FW=214.4) was added to a suspension of purified SWNTs (18 mg, 1.5 mmol of carbon atoms; purified SWNTs (P2-SWNT, www.carbonsolution.com) in dry distilled THF (6 mL). The mixture was sonicated for 2 min. using an ultrasonic probe (Cole-Parmer, 50% amplitude) and then degassed with argon for 15 min. in the absence of light. The mixture was heated at 72° C. for 72 hours in the dark under a positive pressure of argon, after which it was cooled to room temperature. The suspension was filtered through a 0.2 µm PTFE membrane and the solid was washed with anhydrous ether. The resulting chromium-SWNTs complex (~21 mg, isolated yield) was dried overnight under vacuum in the dark. A schematic of the ($\eta^6$-SWNT)Cr($\eta^6$-benzene) complex is presented in FIG. 10.

Figure 11:
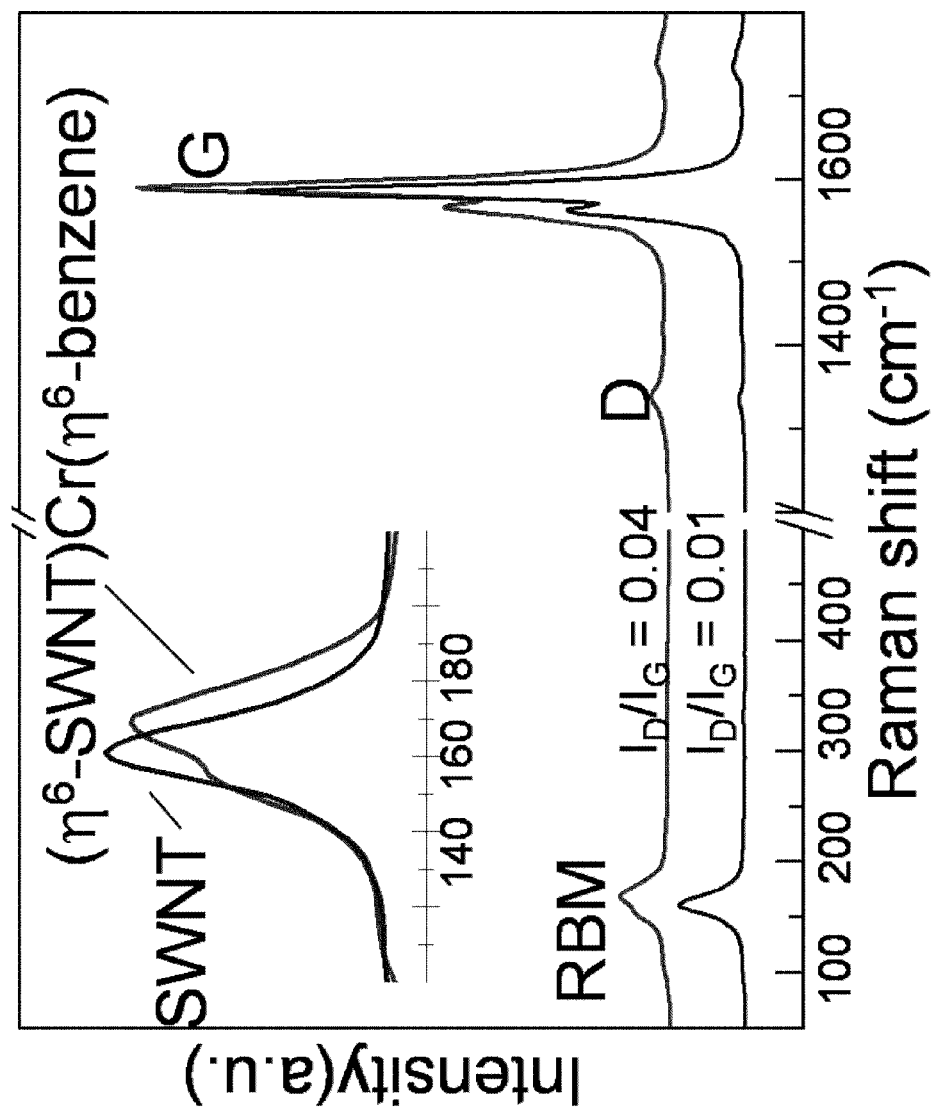
FIG. 11 shows a Raman spectra of single-walled carbon nanotubes (SWNTs) and the complex ($\eta^6$-SWNT)Cr(benzene)
Figure 12:
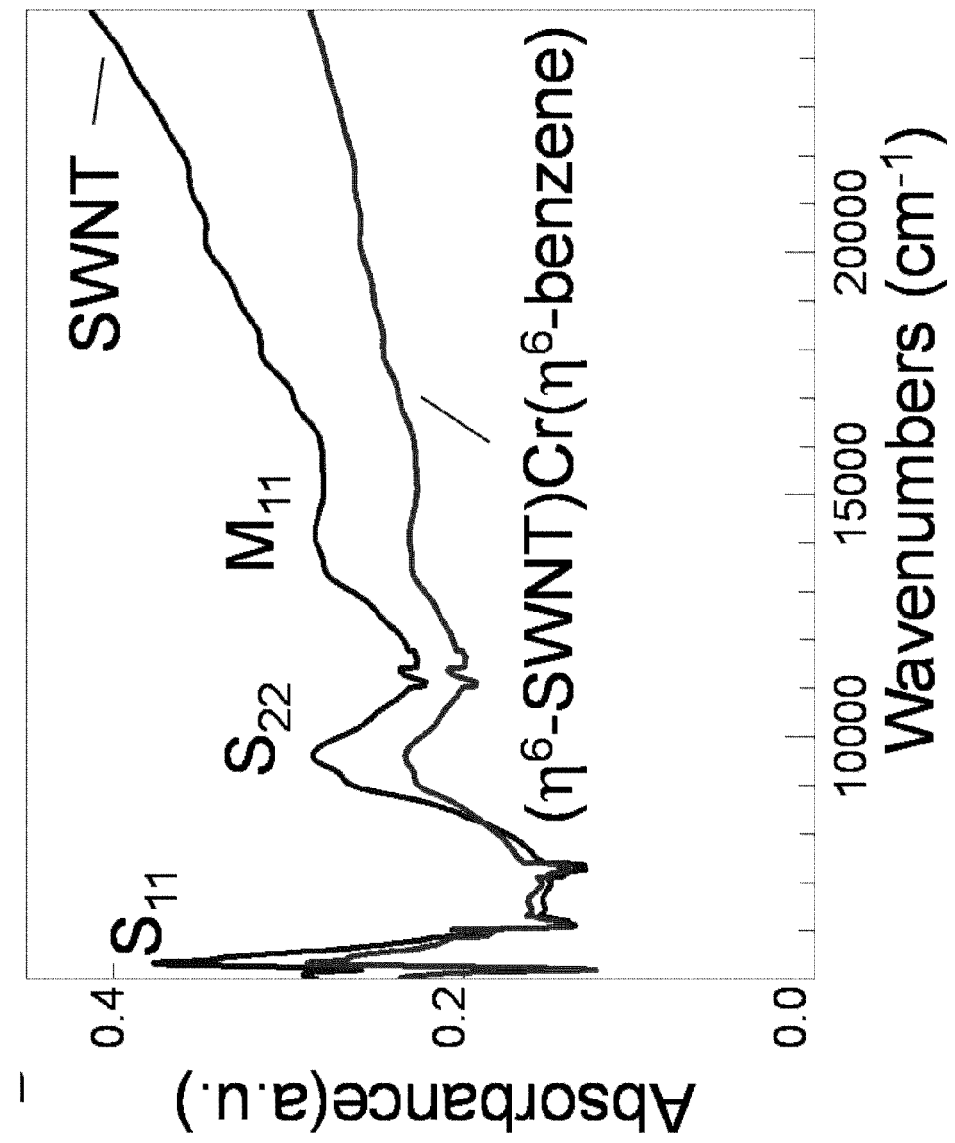
FIG. 12 shows a UV-vis-NIR spectra of single-walled carbon nanotubes (SWNTs) and the complex ($\eta^6$-SWNT)Cr(benzene)

The Raman spectrum of the resulting SWNT-chromium complex shows an apparent increase of the D-band intensity relative to the G-band ($I_D/I_G$~0.04 as compared to $I_D/I_G$~0.01 in the pristine SWNTs) as expected for a sidewall functionalization process, as shown in FIG. 11. The SWNT radial breathing mode (RBM) is resonantly enhanced by interband electronic transitions and the frequency is inversely proportional to the diameter. The NIR-UV-Vis absorption spectrum of the resulting complex in FIG. 12 shows a decrease in the intensities of all interband transitions, as most clearly seen for the second semiconducting interband transition ($S_{22}$). It is apparent that the intensities of the large diameter chiralities are preferentially weakened in the product, suggesting that lower curvature structures will be the most reactive. It will be of interest to those skilled in the art to determine the mode of complexation, as it is possible that the chromium could bind to the interior wall of the carbon nanotubes.

Example 7

Preparation of Free-Standing Pristine Exfoliated Graphene Films

One embodiment of the invention improves the exfoliation technique and provides an easier way to make films of exfoliated graphene of pre-selected thickness and diameter.

i. Exfoliation of Graphite Using Appropriate Solvent:

Microcrystalline graphite (1-2 µm, 500 mg, synthetic, Sigma-Aldrich) was sonicated in o-dichlorobenzene (~200 mL ODCB) for 1 hour using a probe ultrasonic processor (Cole-Parmer) at 40% amplitude. The dispersion was centrifuged at 14000 g for 30 min. The resulting supernatant (which yielded dispersions of graphene in o-dichlorobenzene) was collected. This supernatant was analyzed using Raman (after drying a few drops of the graphene supernatant on a silicon wafer) and UV-vis-NIR spectroscopy. This graphene solution can be concentrated further in a rotary evaporator at elevated temperatures, or by filtrating out the excess ortho-dichlorobenzene.

Regarding the solvents for graphite exfoliation in our present invention, although the above example is illustrated using ortho-dichlorobenzene (ODCB) as a solvent, the solvents for graphite exfoliation according to embodiments of the present invention include, but are not limited to, N,N-dimethylformamide (DMF), N-methylpyrrolidone (NMP), any aromatic solvent (benzene, toluene, p-xylene, monochlorobenzene, ortho-dichlorobenzene, mono-fluorobenzene), naphthalene and derivatives (1- and 2-chloronaphthalene, 1- and 2-fluoronaphthalene, 1- and 2-trifluoromethylnaphthalene), benzylamine (and its derivatives, e.g. N-methylbenzylamine, N,N-dimethylbenzylamine), perfluorinated aromatic solvents (octafluorotoluene), ionic liquids (1-butyl-3-methylimidazolium bis (trifluoromethane-sulfonyl)imide), and any combination of these in their pure form or in any polar, non-polar protic and aprotic solvent (e.g. benzylamine in ethanol/water mixture, ortho-dichlorobenzene in acetone/ethanol).

Representative values of the concentration of exfoliated graphene (in mg/mL) achievable in some of the above solvents are 0.01 (in DMF), 0.03 (in ODCB), 0.22-0.5 (in benzylamine), and 0.6-0.95 (in the ionic liquid, 1-butyl-3-methylimidazolium bis(trifluoro-methane-sulfonyl)imide)). These examples are illustrative rather restrictive, and the concentration of high quality graphene flakes in solution can be significantly improved by slight modification in sonication parameters and choosing appropriate solvent systems.

In embodiments of the present invention, the quality of the graphene solution was judged by recording Raman spectra of the graphene flakes (dried over SiO$_2$/Si substrate) wherein the high quality of graphene flakes is judged by higher $I_{2D}/I_G$ ratios and lower $I_D/I_G$ ratios. Numbers of layers in these exfoliated graphene flakes (XG$_{flake}$) were identified by the shape of the 2D band (e.g., single 2D peak in single layer and multiple 2D peaks in multiple-layer graphene flakes after Gaussian fittings), as well as by their optical contrasts under Raman microscope. The concentration of exfoliated graphene in the solvent (selected for graphite exfoliation) was estimated by comparing the absorbance at 660 nm in the UV-vis-NIR spectra of the solution, wherein the concentration of a known solution was first measured and the molar extinction coefficient was calculated after Lambert-Beer's plot. The molar extinction coefficient of the exfoliated graphene solution in ortho-dichlorobenzene was calculated to be ~2462.5 Lg$^{-1}$m$^{-1}$ at 660 nm. This is consistent with N-methylpyrrolidone (NMP) exfoliated graphene, which is 2460 Lg−1 m−1 at 660 nm (see Hernandez, Y. et al. *Nature Nanotechnology* 2008, 3, 563-56) and ortho-dichlorobenzene (ODCB) exfoliated graphene, which is 2750 Lg$^{-1}$m$^{-1}$ at 660 nm (see Hamilton, C. E. et al. *Nano Letters* 2009, 9(10), 3460-3462).

In another embodiment, the graphene solution (XG$_{sol}$) can be dried to obtain powdered exfoliated graphene (XG$_{powder}$, which could be made by evaporating solvent in rotary evaporator in appropriate solvent and drying in high vacuum overnight. This colloidal graphene powder can be used for subsequent reactions after re-dispersion in a solvent suitable for carrying out further chemical modification of graphene.

ii. Making the Film of Pristine Graphene of Pre-Selected Diameter and Thickness

Figure 13:
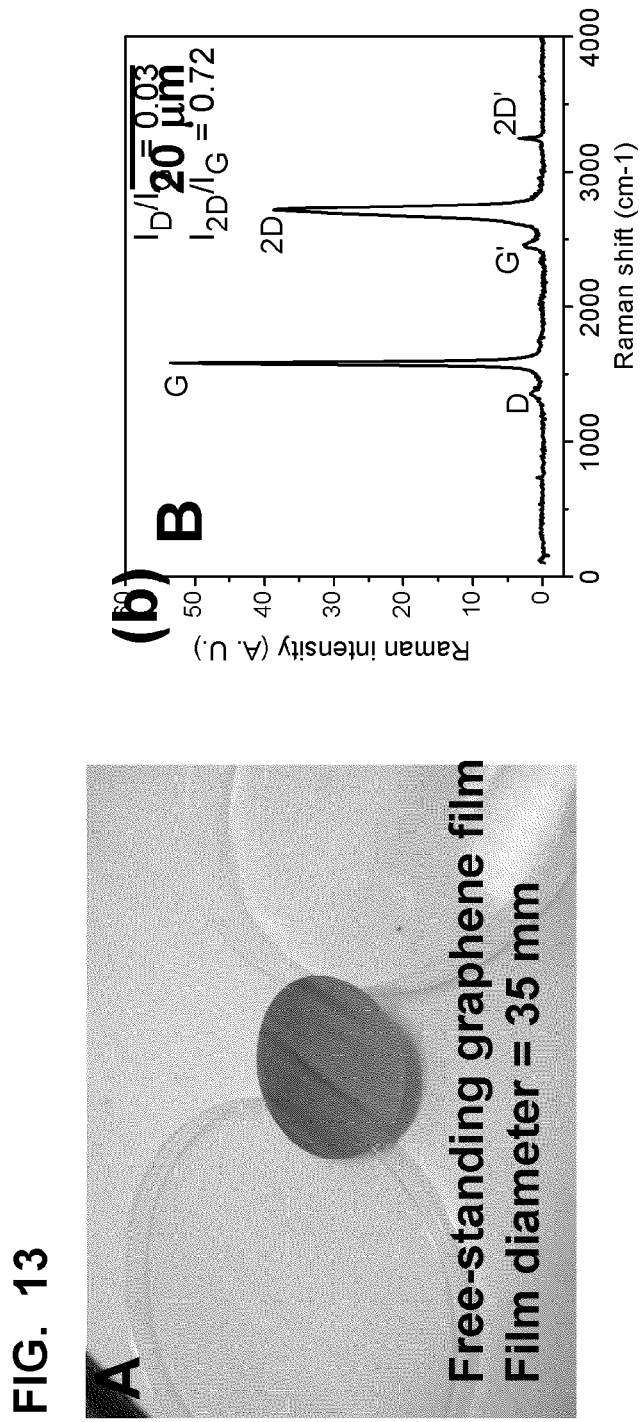
FIG. 13 shows an optical image (A) and Raman spectrum (B) of a free standing graphene film.

Films of exfoliated pristine graphene were prepared by a vacuum filtration method using 0.1 micron membrane filter papers (e.g. Durapore membrane filters 0.1 mm VVPP) and dried under vacuum. The thickness of the film was controlled by applying a known volume of a solution of exfoliated graphene, in which the concentration of an unknown solution is estimated from a known extinction coefficient and measured absorbance. A photograph of the free-standing film of exfoliated graphene and the corresponding Raman spectrum are shown in FIG. 13.

Example 8

Preparation of Free-Standing Films of Graphene-Metal Complexes

Graphene-metal complexes synthesized as described in Examples 1 and 2 and the reaction mixture were filtered using 0.1 micron membrane filter paper (e.g. Durapore membrane filters 0.1 mm VVPP) and dried under vacuum.

Example 9

Preparation of Compressed Free-Standing Films of Graphene-Metal Complexes

Figure 14:
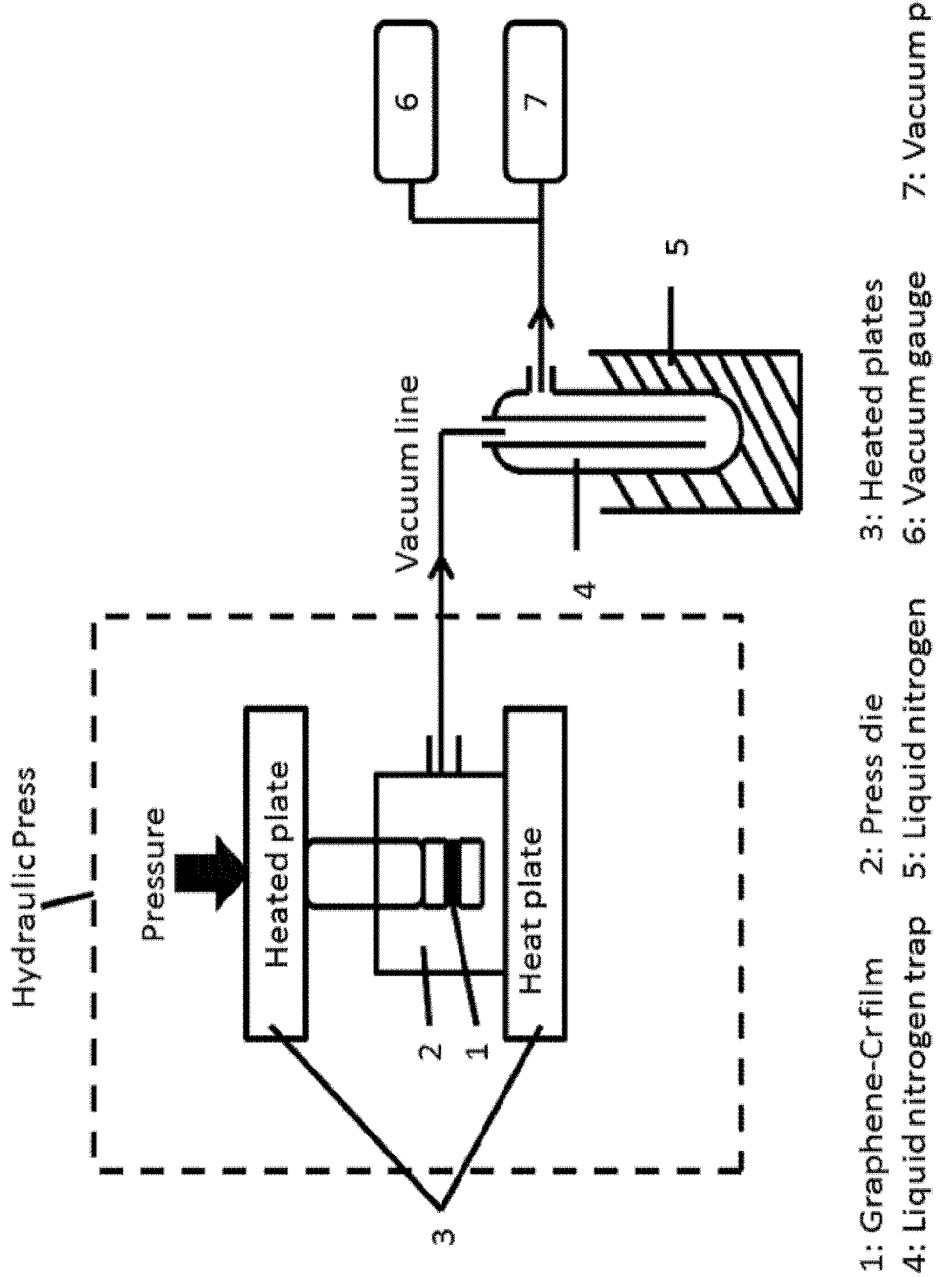
FIG. 14 shows a schematic of an apparatus for heating of free-standing graphene and graphene-Cr films under vacuum.
Figure 15:
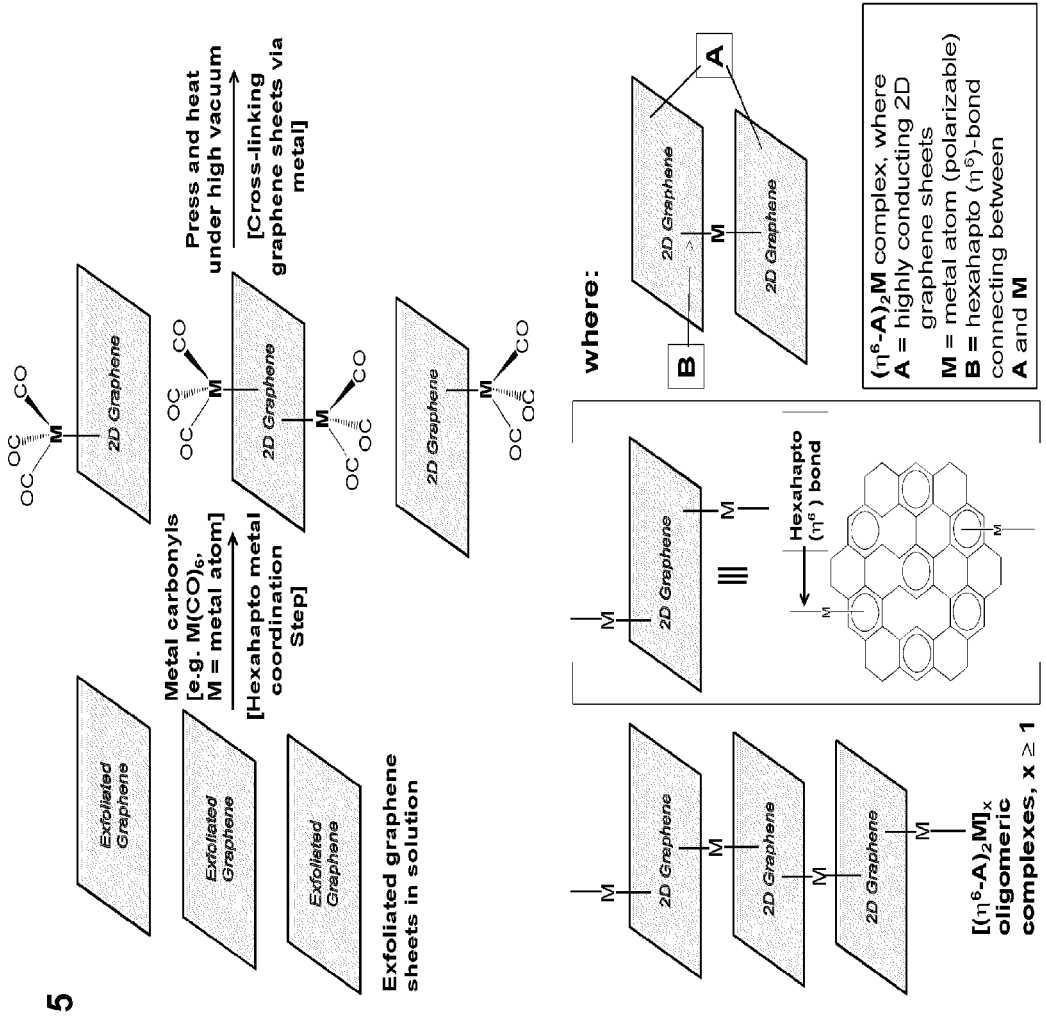
FIG. 15 shows a schematic of the cross-linking of graphene sheets with metal atoms via hexahapto bonds.

The films prepared in Example 8 were pressed under vacuum at elevated temperature to achieve cross-linking of the graphene layers with Cr using the experimental set-up illustrated in FIG. 14. For this procedure, the free standing graphene-chromium film of thickness 5-30 mm was placed in the press die between the stainless steel plates covered with Teflon films to avoid contamination. The press die was connected to the vacuum line which included liquid nitrogen trap. A pressure of 100 lb. was applied to the film initially at room temperature. A vacuum of $10^{-4}$ Torr was applied after which the die temperature was slowly increased to 150° C. utilizing the heated plates of the hydraulic press. The high temperature was maintained for 2 hours to complete the cross-linking. After cooling to room temperature, the vacuum was released and the graphene-Cr cross linked film was removed from the die. This results in graphene sheets cross-linked with metal atoms via hexahapto bond as illustrated in FIG. 15.

Figure 16:
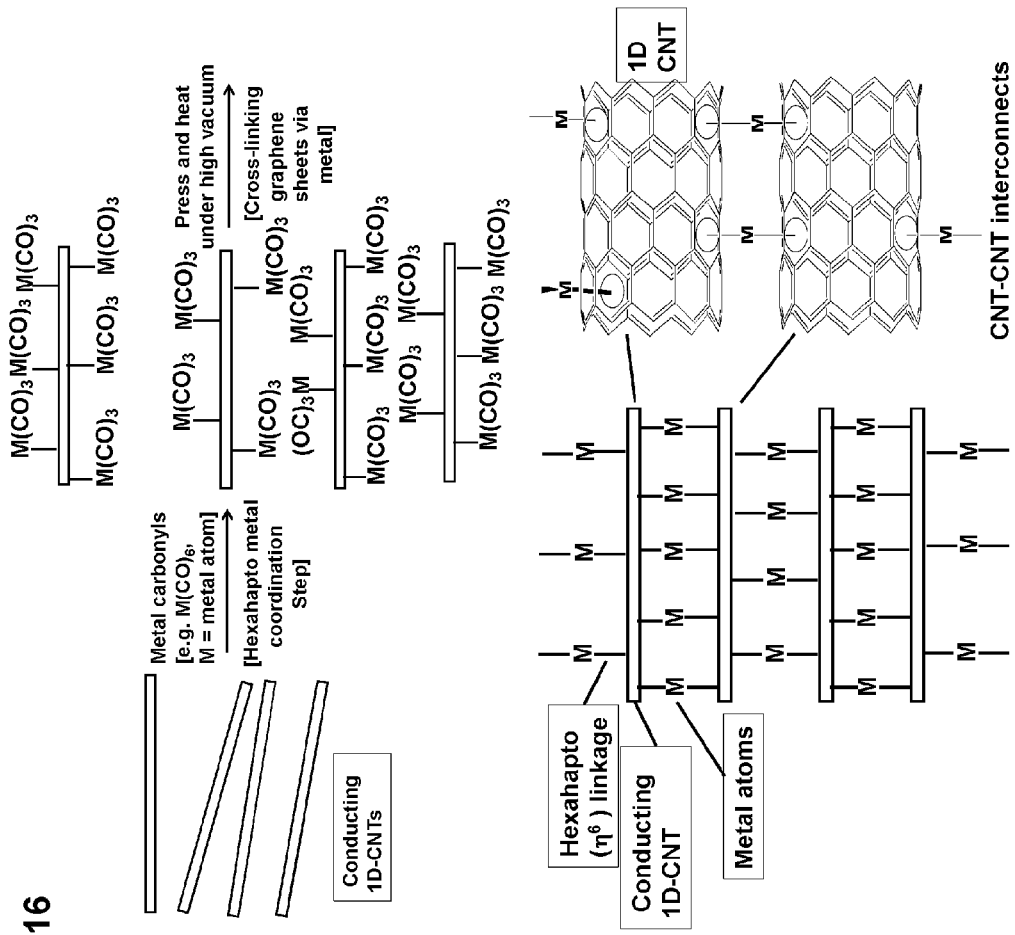
FIG. 16 shows a schematic of the cross-linking of single-walled carbon nanotubes (SWNTs) with metal atoms via hexahapto bonds.

The same procedure has provided single-walled carbon nanotubes (SWNTs) cross-linked with metal atoms as shown in FIG. 16.

A clear differentiator between the atomic intercalation compounds reported to date and the metal complexation reported in the present disclosure (apart from the degree of charge transfer), is the bond distance between the complexed benzene rings and the bond distance that has been reported in standard graphite intercalation compounds. In ionic atomic graphite intercalation compounds, the shortest separation distances between planes are: $LiC_6$ (3.72 Å), $NaC_8$ (4.5 Å), $CaC_6$ (4.424 Å), and KC8 (5.4 Å).

Figure 17:
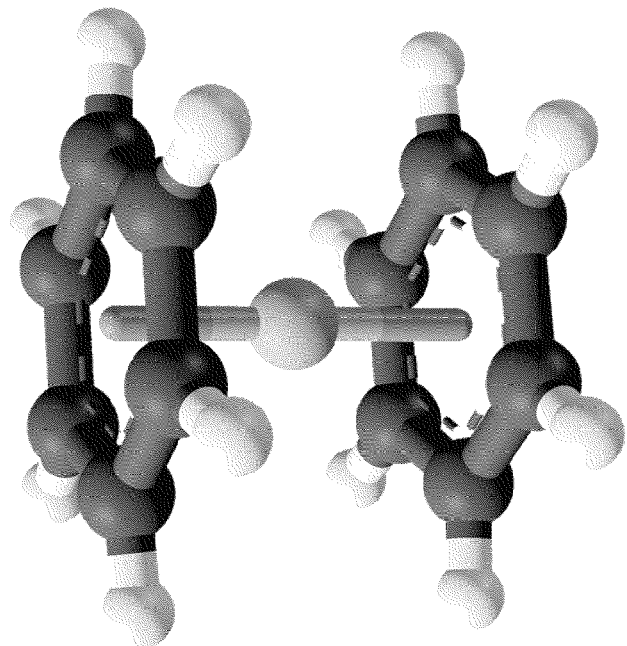
FIG. 17 shows a schematic of the structure of bis(benzene) chromium.
Figure 17:
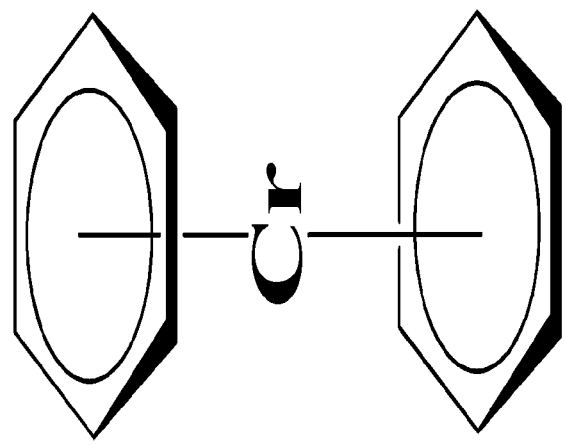

The experimental distance between benzene rings in (benzene)$_2$Cr is 3.226 Å (FIG. 17). Thus, the distances in complexes according to embodiments of the invention will be much smaller than for traditional atomic graphite intercalation compounds, for example, less than 3.6 Å (note that lithium is somewhat anomalous due to its very small size).

Figure 18:
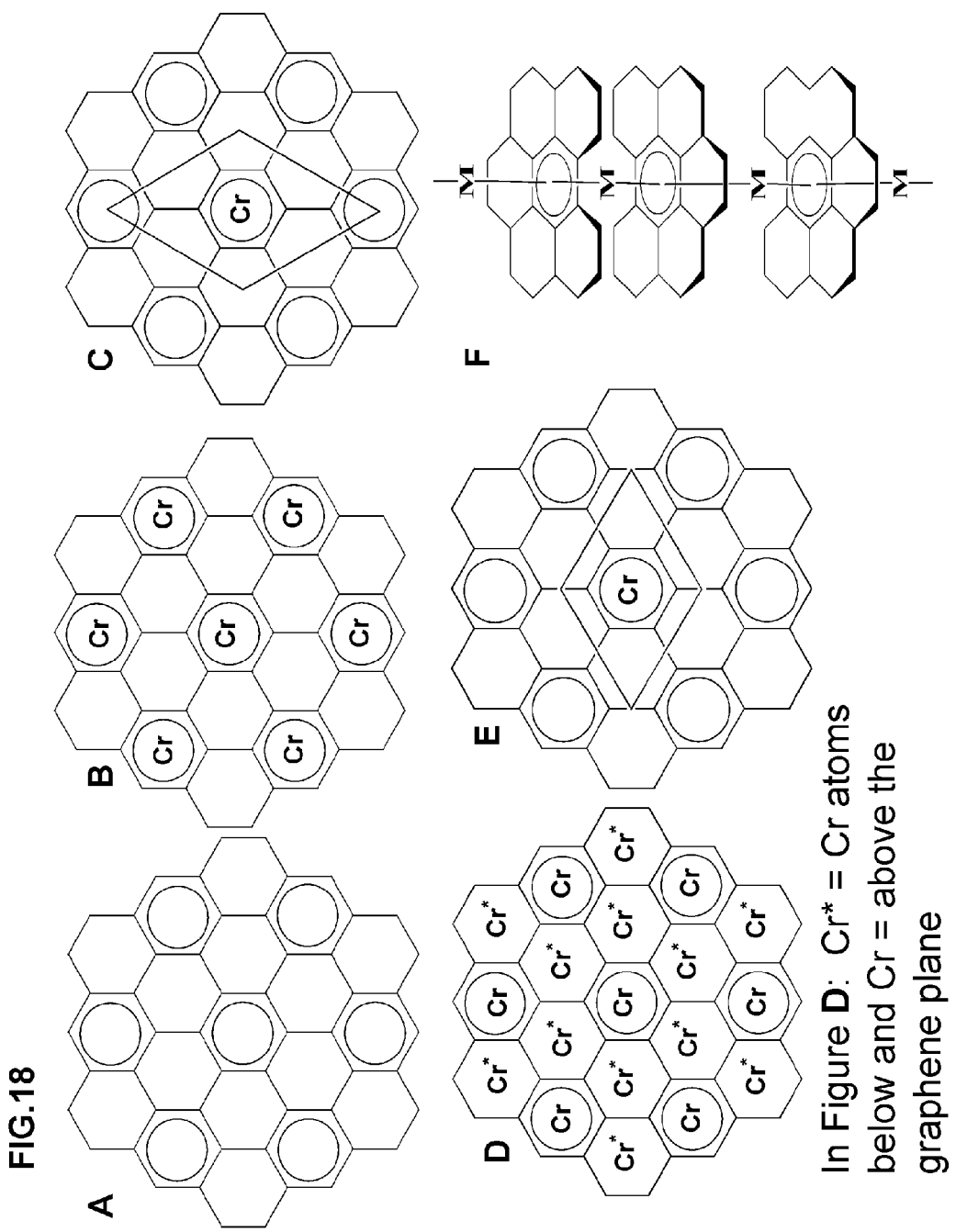
FIG. 18 shows a schematic of carbon-metal complexes of different composition, where (A) is the Clar representation of graphene and (B-F) are graphene-metal bonding configurations, where M represents a metal selected from the group in claim 2 (the structural units (B-F) are not all unit cells and may repeat differently between graphene planes)

Varying the degree of functionalization produces carbon-metal complexes with a composition from C:Cr=2:1 to 1000:1. Examples of different bonding configurations are illustrated in FIG. 18.

Example 10

Reversibility of Hexahapto Complexation

The reversibility of this graphene-metal hexahapto complexation is another attractive feature of embodiments of the invention, offering a new appealing route to the controlled, reversible chemical engineering of the band structure and transport properties of graphene in a simple, efficient and reproducible manner.

While the graphene-metal bond is believed to be robust and inert to a number of reaction conditions, the ($\eta^6$-graphene)Cr(CO)$_3$ or ($\eta^6$-graphene)$_2$Cr complexes can be readily cleaved upon oxidation of the metal with Ce(IV), Fe(III), $I_2$, hv/O$_2$. A mild procedure involves exposure of a solution of the complex in diethylether or acetonitrile to sunlight and air for several hours. Another procedure involves heating the complex in the presence of electron-rich arenes (e.g., mesitylene).

Although literature reports show that arene-chromium complexes can be de-complexed by refluxing the complex in pyridine (which cleaves the metal-arene bond and allows recycling of the Cr(0) complex in the form of Cr(CO)$_3$(py)$_3$, application of this protocol to the graphene-chromium complexes resulted in a black homogeneous solution, presumably because of further exfoliation and dispersal of graphene flakes. The resulting material was soluble in pyridine, THF and chloroform.

Figure 19:
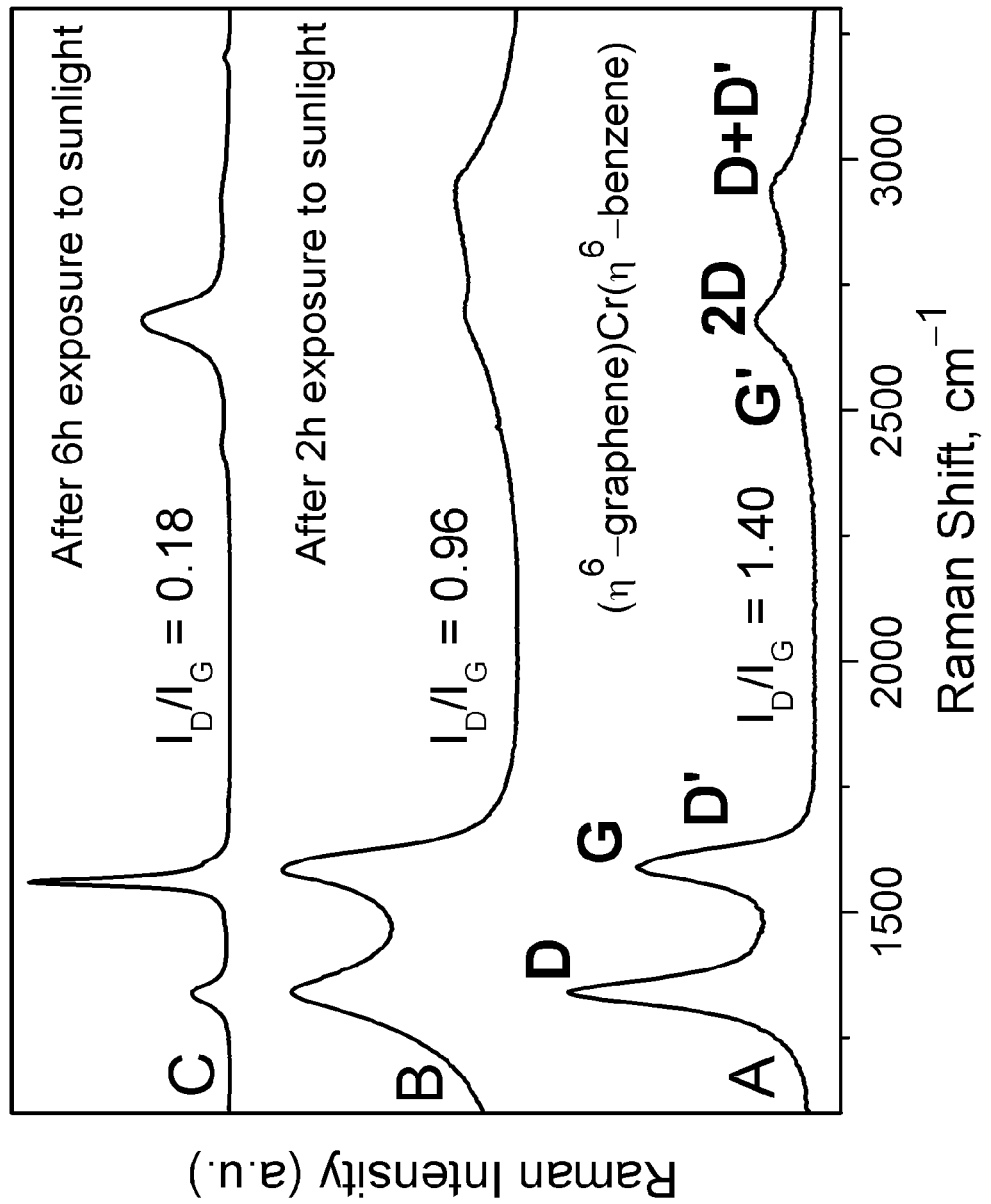
FIG. 19 shows (A) Raman characteristics of the ($\eta^6$-graphene)Cr($\eta^6$-benzene) complex, before exposure to sunlight and (B, C) after 2 hours and 6 hours exposure to sunlight, respectively.

The Raman spectra of FIG. 19 shows that graphene can be regenerated from the ($\eta^6$-graphene)Cr($\eta^6$-benzene) complex (FIG. 19C) under exposure of the dispersions of the complexes in acetonitrile to white light (e.g., sunlight) in ambient conditions for 6 hours. Exposure to white light under identical conditions for 2 hours was insufficient to regenerate the pristine graphene.

The ability of graphene to be regenerated from ($\eta^6$-graphene)$_2$Cr complex under exposure to white light (sunlight) in open air for 3 hours and the spectra of the resulting complex is similar to that of pristine graphene.

The strength of the ($\eta^6$-graphene)-Cr bond was investigated by running a series of competition reactions with electron rich arenas. While a 12-hour reflux under an argon atmosphere in benzene or p-xylene was insufficient to completely displace the graphene from the Cr coordination sphere, treatment with refluxing mesitylene fully regenerated the starting graphene ($I_D/I_G$=0.07), as characterized by Raman spectroscopy.

Figure 20:
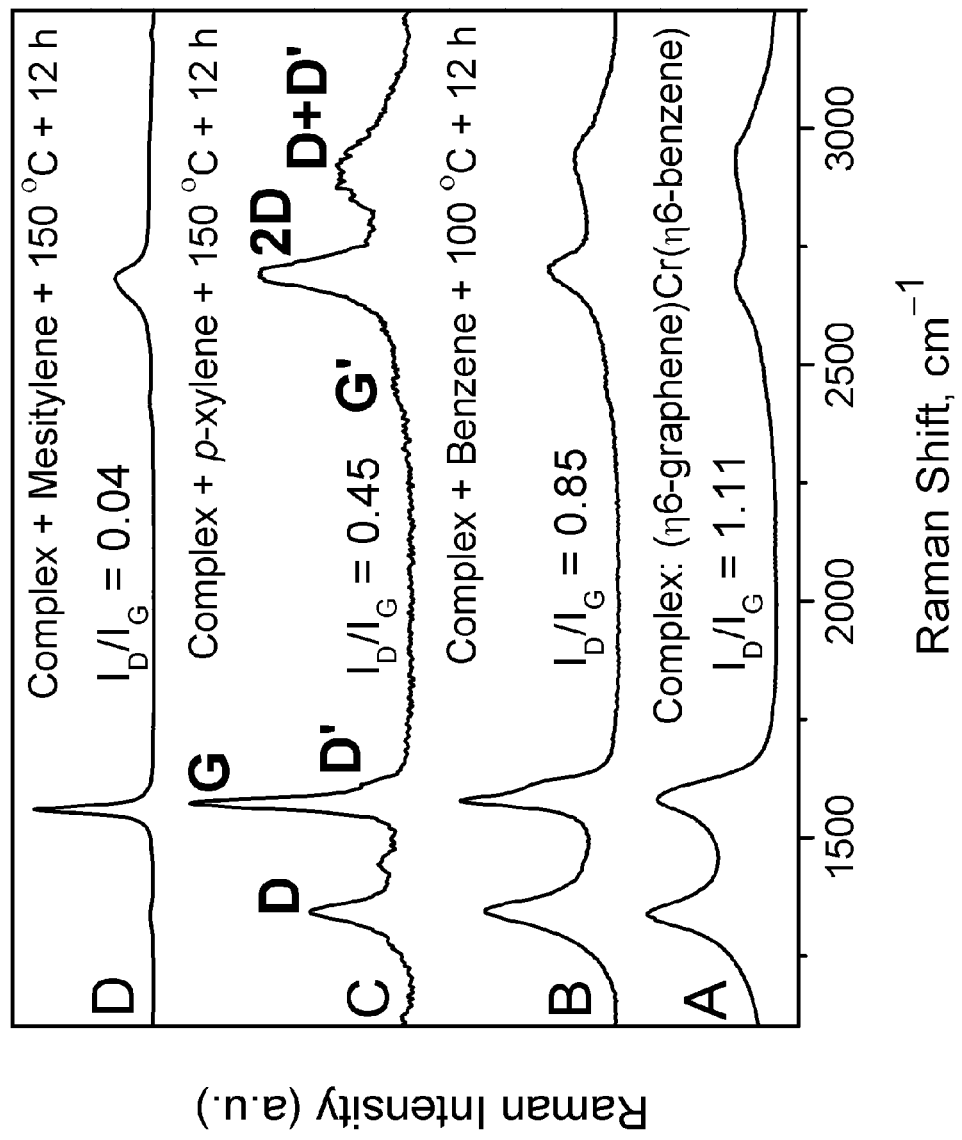
FIG. 20 shows a Raman spectra of the complex ($\eta^6$-graphene)Cr(benzene) (A) before and after heating in (B) benzene, (C) p-xylene and (D) mesitylene (the Raman spectra of the complex ($\eta^6$-graphene)Cr(benzene) heated in mesitylene (D) shows the disappearance of the D-band)

Thus, heating the ($\eta^6$-graphene)Cr($\eta^6$-benzene)complex ($I_D/I_G$~1.1, FIG. 20A) in benzene (oil bath temperature 100° C.; final $I_D/I_G$=0.85; FIG. 20B) or p-xylene (oil bath temperature 150° C.; final $I_D/I_G$=0.45; FIG. 20C) was insufficient to fully regenerate the pristine graphene sample, whereas heating in mesitylene (oil bath temperature 150° C.; FIG. 20D) gave a final $I_D/I_G$=0.04, indistinguishable from the starting graphene sample. Thus, it is apparent that the ($\eta^6$-Graphene)Cr is fairly robust; the ($\eta^6$-Benzene)$_2$Cr bond energy was found to be 164 kJ mol$^{-1}$.

In the present example, the ($\eta^6$-graphene)Cr($\eta^6$-benzene) complex (20 mg) was either refluxed or warmed (oil bath temperature of 100° C. for benzene, 150° C. for p-xylene and 150° C. for mesitylene) with the arene (~5 mL) under argon overnight. The resulting reaction mixture was filtered through a 0.2 μm PTFE membrane, and the solid was washed with a copious amount of anhydrous diethylether. In the case of reaction between the graphene-chromium complex and mesitylene, the filtrate (obtained during washing of the solid with diethylether) was deep yellow in color, presumably because of the removal of the chromium from the complex as ($\eta^6$-mesitylene)Cr($\eta^6$-benzene) complex. The resulting solid was dried for 1 hour under high vacuum, and characterized by Raman spectroscopy.

Example 11

Electronic Properties of Cr Intercalated Carbon Nanotube Thin Films

In the present example, chromium (Cr) was intercalated into carbon nanotube thin films by electron-beam deposition of Cr atoms. The electronic transport properties of single-walled carbon nanotube (SWNT) films were studied in situ during Cr atom deposition. Carbon nanotubes of different types with different ratios of semiconducting to metallic SWNTs, and multiwall carbon nanotubes, were investigated. All of the experiments showed qualitatively the same behavior: intercalation of Cr atom resulted in significantly reduced electrical resistivity.

The results of intercalation of Cr atoms into thin films of 99% semiconducting SWNT are presented here. SWNT films were prepared from the dispersions in water by vacuum filtration using an alumina membrane disk (47 mm dia, 0.02 um pore size, 34 mm working dia.). The thickness of the SWNT films was controlled by the amount of the SWNT material utilized for the vacuum filtration taking into account the working area of the filtration membrane. The final thickness calibration was obtained by use of a Dektak profilometer on a thicker (>100 nm) SWNT films. The data was taken on the films prepared from a dispersion of 0.01 mg of SWNT material in 100 mL of solvent with a resulting thickness t~9 nm corresponding to a SWNT film density of 1.2 g/cm$^3$. For the conductivity measurements, the SWNT film with width of 2 mm and length of 2 mm was transferred onto an array of gold interdigitated electrodes, with a gap between the interdigitated fingers of 100 nm. All the samples were annealed at 350 C for 2 hours at vacuum $10^{-7}$ torr before use.

The Cr deposition was conducted with a Temescal BJD 1800 electron beam evaporator operating in a base pressure of $10^{-7}$ Torr. The growth of the metal film was monitored during the deposition with a quartz crystal micro balance. The temperature increase of the sample during the evaporation process was monitored with a thermocouple and was less than 10K during the process. All measurements were carried out in situ in an evaporator vacuum to avoid the oxidation of Cr in ambient environment.

Figure 21:
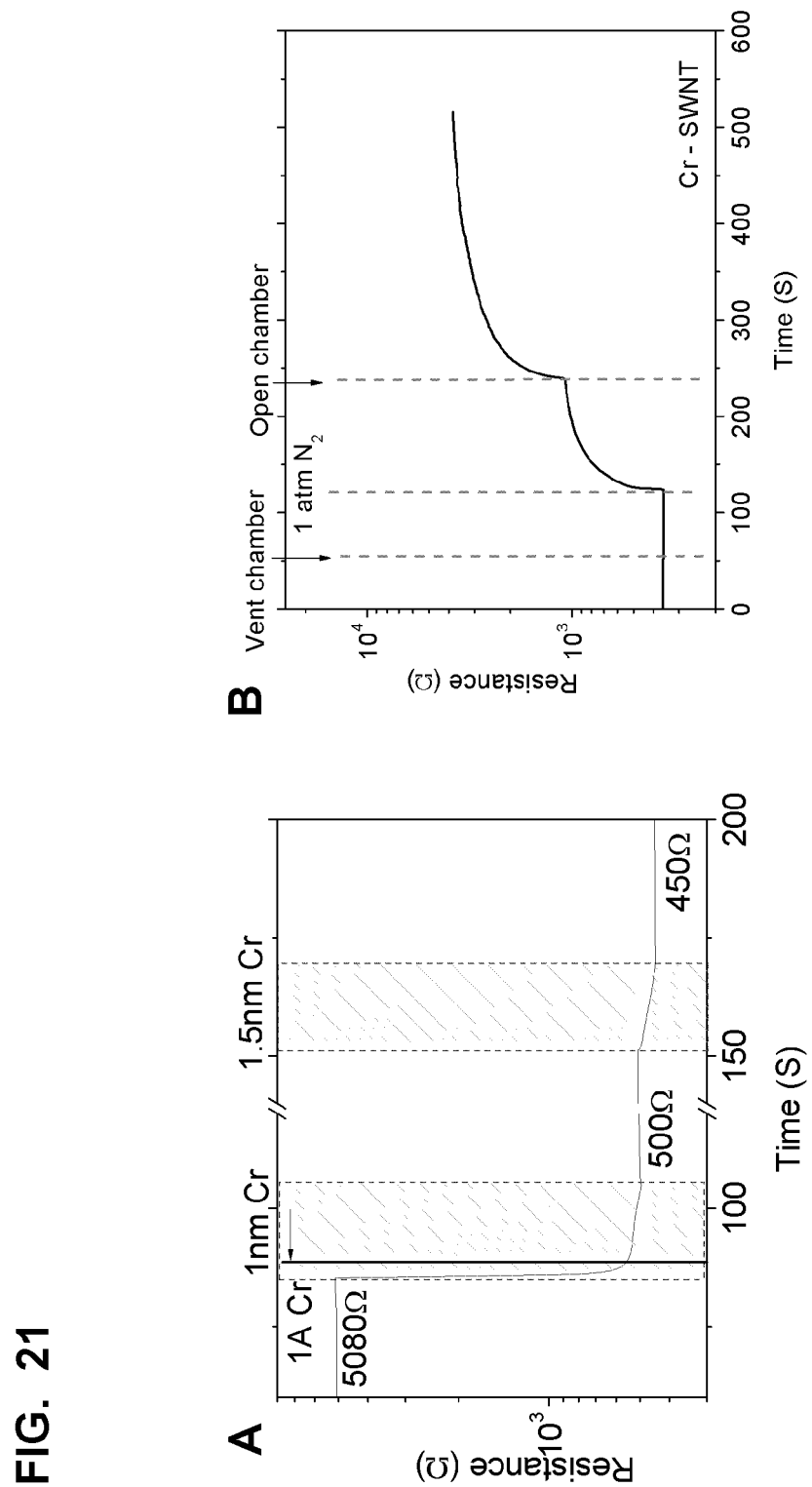
FIG. 21 shows the resistance of SWNT film during (A) Cr deposition and (B) exposure to atmosphere.

The starting electrical conductivity of the annealed pristine SWNT film was 8 S/cm. The resistance was measured as a function of time of exposure to evaporated Cr atoms (FIG. 21). In total, 1 nm of Cr was evaporated on the SWNT film at the rate of 0.3-0.5 Angstroms/second. A dramatic drop of the resistance was observed immediately after the exposure to Cr; less than 1 Angstrom of Cr atom deposition resulted in the resistivity drop by the order of magnitude. As the deposition continued, the decrease of the resistance of the SWNT film became very slow. This phase of the resistance change was slow and may be ascribed to the conductivity occurring on the bulk Cr film that formed on the top of the SWNT film as a parallel conducting channel. As the deposition stopped, the high conductive state of the SWNT film was maintained. Additional 1.5 nm of Cr was deposited after the electron-beam evaporator chamber was cooled down to room temperature. A slight additional drop of the resistance was observed this time as a continuous Cr film was increasing in thickness. After the exposure to the atmosphere the resistivity of the SWNT slowly recovered to the level of pristine SWNT due to exposure to air (FIG. 21B).

To ensure that the initial dramatic drop of the resistance was not due to the formation of a continuous film on the surface of SWNT, substrates with two identical sets of interdigitated electrodes were prepared. One set of electrodes was covered by the SWNT film, while the other reference set was open to direct deposition of Cr. During the initial stage of the deposition of ~1 Angstrom of Cr corresponding to the dramatic drop of the resistance of the SWNT film, the open interdigitated channel remained insulating. Only after deposition of 3 nm of Cr, the resistance of the reference channel decreased to $10^9$ Ohm, which is 6 orders of magnitude higher than the resistance of Cr-intercalated SWNT channel. Thus, a significant increase of conductivity of SWNT films was observed when the blank remained insulating and hence the dramatic drop of resistivity cannot be explained by the parallel resistance of continuous Cr film.

Figure 22:
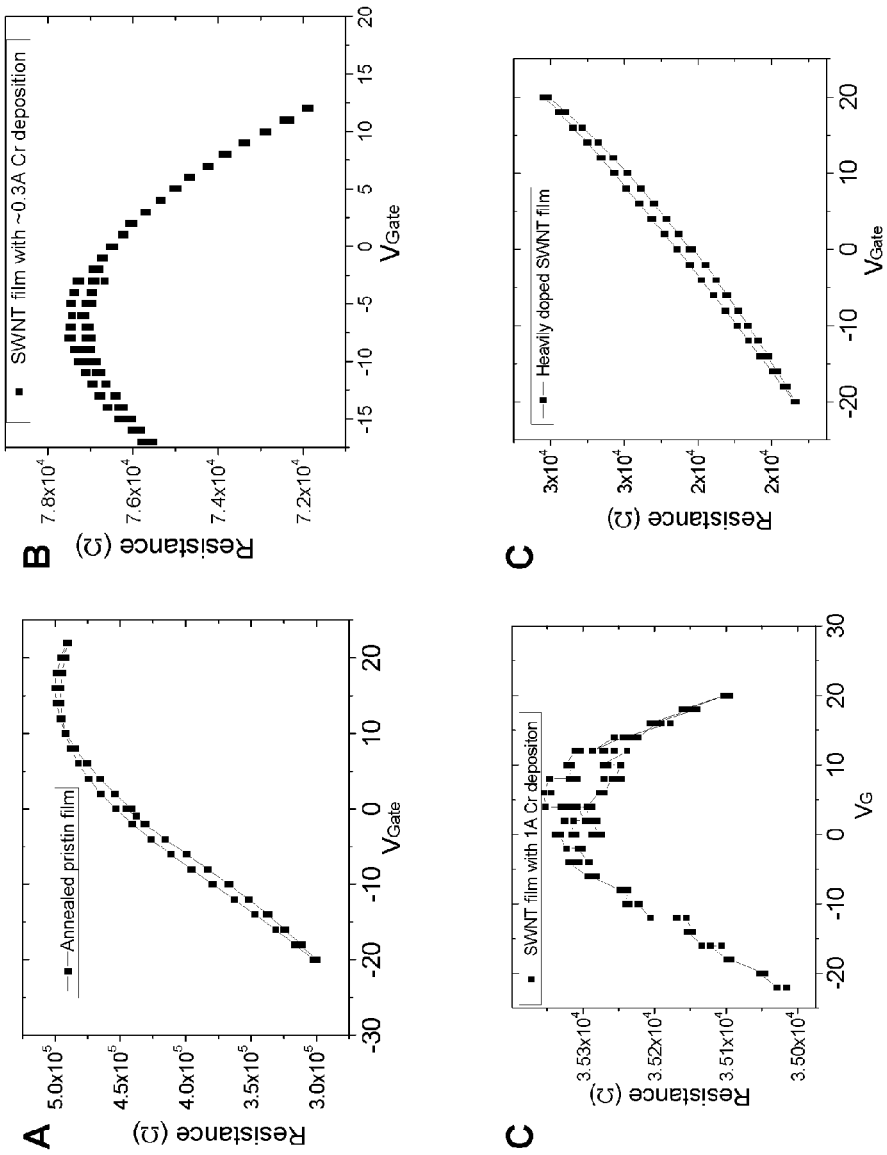
FIG. 22 shows the FET performance of: (A) annealed SWNT film; (B) SWNT film after deposition of 0.3 A of Cr; (C) SWNT film after deposition of 1 A of Cr; (D) heavily p-doped SWNT film.
Figure 23:
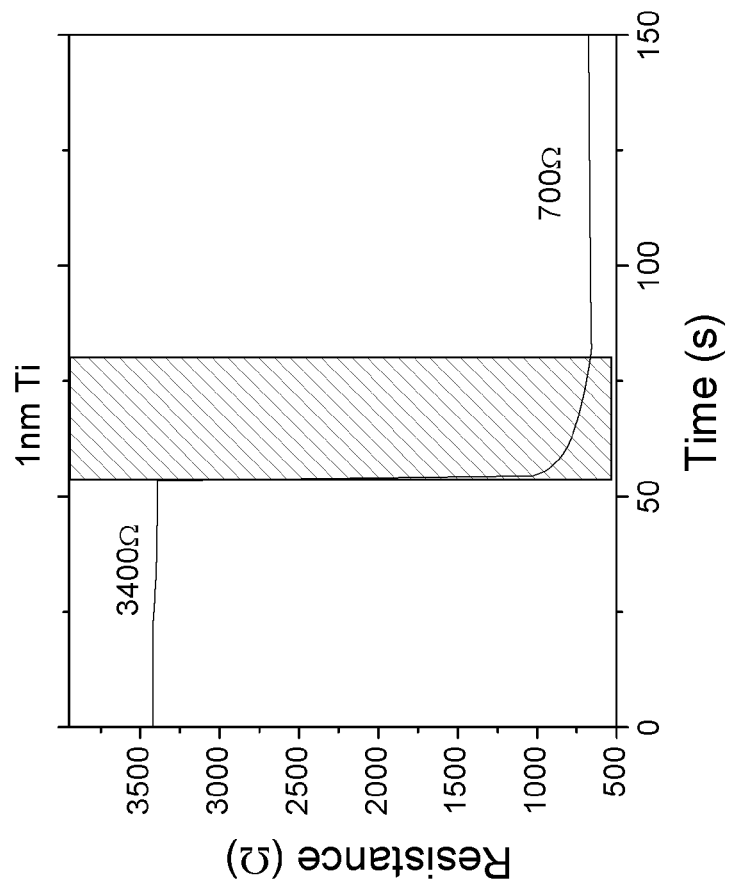
FIG. 23 shows the change of resistance of SWNT film during titanium (Ti) deposition.

Electronic transport properties were further studied using a bottom gated thin film transistor configuration. A heavily doped n-type silicon wafer, with a 150-nm-thick insulating $SiO_2$ layer, was used for the bottom electrode. The SWNT film in the form of a narrow ribbon having a width 0.5 mm and a length 2 mm was transferred onto the surface of the $SiO_2$ layer. Silver paste was used for the contacts to the drain and source electrodes. The transfer characteristics of the pristine and Cr intercalated SWNT field effect transistor (FET) were measured in situ in the evaporator chamber using electronics controlled by custom developed LabVIEW software. Before the deposition of Cr, the SWNT film showed p-doped behavior: the off-state was observed at a positive $V_G$ (FIG. 22A). With the small amount of Cr deposition (<0.3 A), the film showed a switch to n-type behavior (FIG. 22B). The measurements of source-drain current versus $V_G$ of heavily (p-type) doped SWNT film, whose conductivity is around 70 S/cm, was almost linear with $V_G$ (FIG. 22D). The neutrality point was shifted to the positive polarity beyond the maximum gate voltage that could be applied.

The dramatic drop of the resistance of the Cr intercalated SWNT film is ascribed to the formation of highly conductive bridges between SWNTs formed by intercalating Cr atoms.

Example 12

Synthesis of HOPG-Chromium Complexes Using Naphthalene as a Foreign Ligand

In the present example, a piece of HOPG (area=~0.25 cm$^2$) was added to a solution of chromium hexacarbonyl [$Cr(CO)_6$, 33 mg, 0.155 mmol] in n-dibutyl ether in a Schlenk reaction vessel, followed by addition of naphthalene (2 equivalents), while heated at 100° C. under argon atmosphere. The reaction mixture turned light yellow after heating for 1 h at 100° C., then to slight brown after 4 h, which turned to a deep reddish brown solution after heating overnight at the same temperature under a positive pressure of argon, presumably because of in-situ formation of unstable (naphthalene)$Cr(CO)_3$ and (naphthalene)$_2$Cr complexes. Dry, distilled tetrahydrofuran (THF, ~5 mL) was added to the deep reddish brown reaction mixture, which immediately turned to a yellow solution due to decomposition of the labile (naphthalene)-chromium complexes in THF. This yellow solution with HOPG wafer was heated at 100° C. for another 60 h to obtain chromium-linked graphene planes in HOPG.

In the present example, naphthalene was added to the reaction mixture for two reasons: (1) in view of the expectation of in situ formation of the labile (naphthalene)$Cr(CO)_3$ complex, in order to obtain initial facile arene exchange reaction between naphthalene and graphene layers, and (2) so that the aromatic π-electrons of naphthalene can interact with the conjugated π-electrons on the graphene surface through π-π interaction and consequently can transport the active chromium metal [in the form of labile (naphthalene)$Cr(CO)_3$ complex] in between graphene planes.

X-ray diffraction (XRD) data of the HOPG-chromium complexes show contraction of the interlayer distance between graphene planes in HOPG (3.35 Å) after complexation and is reduced to 3.201 Å; which is comparable to the distance between two benzene rings (3.226 Å) in (benzene)$_2$Cr derivative (FIG. 17). Hexahapto chromium bonding between graphene planes contracts the interlayer spacing between the planes of graphene in graphite. This is related to depleted π-electron density between the graphene planes, which would lead to shorter interlayer distance. This is remarkably distinct form the interlayer distances in traditional ionic intercalation compounds, which are much higher than the original interlayer distances between graphene layers in graphite (3.35 Å).

The same reaction was also performed using gas-phase chemistry inside a Parr high-pressure stainless "Bomb" vessels inside an oven set at temperatures 100-150° C., where the temperature was gradually increased and the vessel containing the piece of HOPG and chromium hexacarbonyl was closed inside the glove box (under argon atmosphere) for 3 days.

Example 13

Synthesis of Cross-Linked Graphene-Chromium Complexes in Presence of a Foreign Ligand, Naphthalene In the present example, microcrystalline graphite powder or exfoliated graphene with microcrystalline, graphite (250 mg, 20.8 mmol) was dispersed in anhydrous n-dibutylether (n-Bu$_2$O, 35 mL) and dry, distilled tetrahydrofuran (THF, 5 mL), under argon using brief sonication (for ~2 min.) in a Schlenk vessel. Chromium hexacarbonyl [Cr(CO)$_6$, 500 mg, 2.27 mmol] was then added into the Schlenk vessel, followed by the addition of naphthalene (600 mg, 4.68 mmol). The reaction mixture was heated and stirred vigorously under argon at 130° C. for 7 days. The graphene-chromium cross-linked product, [(graphene)Cr]$_n$(graphene), where n is any integer number ≥1(385.2 mg) thus obtained was purified by washing with copious amounts of hexane and THF and dried under vacuum.

Raman spectroscopy obtained from the product, [(graphene)Cr]$_n$(graphene), was quite distinct from form the ionic intercalation products of graphite. The Raman spectra of pristine microcrystalline graphite typically showed a G band at 1570 m$^{-1}$ and 2D band at 2704 cm$^{-1}$. The formation of cross-linked [(graphene)Cr]$_n$(graphene) products led to the appearance of weak to moderate D peak (low I$_D$/I$_G$ ratios) in its Raman spectra, and the G peak split into two peaks, which appeared at 1570 and 1592 cm$^{-1}$. The 2D peak, the shape and frequency of which is characteristics to the number of layers, downshifted to 2673 cm$^{-1}$. The intensity of 2D peak also decreased significantly and in some cases it disappeared completely, which clearly indicates that the graphene planes are decoupled after chromium coordination after formation of [(graphene)Cr]$_n$(graphene) products. These significant up shifts of second G peaks by ~22 cm$^{-1}$ and down shifts of 2D peaks by ~31 cm$^{-1}$ could be ascribed to the electronic perturbation of the graphene layers in graphite due to their interconnections through hexahapto mode of coordination via chromium atoms.

The Raman spectra of these neutral graphene-chromium cross-linked products are quite distinct from the ionic intercalation compounds of graphite and few-layer graphene flakes. Ionic intercalation of few-layer graphene with the ionic intercalating reagent, for example, by iron(III)trichloride (FeCl$_3$) is reported to shift the G band frequencies to a much higher frequency (1627 cm$^{-1}$) and also multiple (more than two) G peaks were reported to be observed in case of non-uniform ionic intercalation (see Zhao, W. et al. Journal of the American Chemical Society, 2011, 133 (15), 5941-5946)

Example 14

Synthesis of Graphene-Molybdenum and HOPG-Molybdenum Complexes

In the present example of a reaction between graphene (or HOPG), exfoliated graphene (250 mg, 20.8 mmol) was dispersed in anhydrous n-dibutylether (Bu$_2$O, 35 mL) and dry, distilled tetrahydrofuran (THF, 5 mL), under argon using brief sonication (for min.) in a Schlenk vessel. Molybdenum hexacarbonyl [Mo(CO)$_6$, 500 mg, 1.89 mmol) was then added into the Schlenk vessel. The reaction mixture was heated and stirred vigorously under argon at 130° C. for 7 days. The graphene-molybdenum complexes (385.2 mg) thus obtained was purified by washing with copious amounts of hexane and THF and dried under vacuum. The same reaction can also be conveniently performed using a Parr high-pressure stainless "Bomb" vessels inside an oven set at temperatures 100-150° C., where the temperature was gradually increased.

Example 15

Deposition of Cr onto HOPG

Experiments of intercalation of Cr into highly oriented pyrolytic graphite (HOPG) were conducted. Cr atoms were held so that deposition was perpendicular to the surface of the film; thus deposition occurred on the (110) face of bulk HOPG at temperature from 300 to 1500 K. Previous work has shown that deposition of metal films on top the HOPG at temperatures up to 1500K, is ineffective in bringing about intercalation except in the case of electropositive atoms which can initiate charge transfer to the HOPG layer.

The HOPG block (~2×1×0.1) mm$^3$ in size were placed on a sapphire substrate and locally heated inside the electron-beam evaporator chamber. The transverse conductivity of HOPG was measured using four probes wired to the opposite (111) faces with (110) face open to the Cr source. In situ transverse conductivity measurements of HOPG were conducted in the temperature range 300-600 K during Cr deposition. No significant change of transconductivity was observed up to 600K, but experiments conducted at higher temperatures are expected to be successful.

Example 13

Deposition of of Ti into CNT Films

In the present example, titanium (Ti) was complexed with carbon nanotubes in a film by direct deposition. A similar dramatic drop of the resistance was observed; 1 nm of Ti atom deposition resulted in an increase in conductivity that was 5 times in magnitude. The Ti intercalated SWNT was not stable under ambient conditions.

Embodiments of the present invention have been described in relation to grafting of a particular metal to graphene, which is intended in all respects to be illustrative rather than restrictive. Alternative embodiments and their potential use as reusable organometallic catalysts in a wide range of applications to which the embodiments of the present invention pertain will be apparent to those skilled in the art, without departing from scope.

What is claimed is:

1. A method of modifying a carbon material, the method comprising:
   bonding a metal to a carbon material to form a metal-carbon complex comprising the metal and a benzene unit,
   wherein the carbon material comprises extended $sp^2$-bonded carbon atoms and wherein the method is reversible such that the metal-carbon complex can be de-complexed by an oxidative de-complexation method.

2. The method of claim 1, wherein the metal is selected from the group consisting of scandium, yttrium, lanthanum, titanium, zirconium, hafnium, vanadium, niobium, tantalum, chromium, molybdenum, tungsten, manganese, technetium, rhenium, iron, ruthenium, osmium, praseodymium, neodymium, promethium, samarium, europium, gadolinium, terbium, dysprosium, holmium, erbium, thulium, ytterbium and lutetium.

3. The method of claim 1, wherein the metal is bonded to the carbon material by covalent bonding.

4. The carbon-based material of claim 1, wherein the metal is bonded to the carbon material by hexahapto bonding or bis-hexahapto bonding.

5. The method in claim 1, wherein the carbon material is selected from the group consisting of graphite, exfoliated graphene, single-layer graphene, bi-layer graphene, multi-layer graphene, epitaxial graphene, CVD grown graphene, microcrystalline graphene, microcrystalline graphite, highly oriented pyrolytic graphite, single-walled carbon nanotubes, double-walled carbon nanotubes, multi-walled carbon nanotubes, microcrystalline synthetic graphite, carbon fibers, carbon whiskers, turbostatic graphite, activated graphite, glassy carbon and carbon black.

6. The method in claim 2, wherein the metal-carbon complex is selected from the group consisting of (graphene)M(CO)$_3$, (graphene)M(arene), (graphene)M(graphene), (arene)[M(graphene)]$_n$(arene) and [(graphene)M]$_n$(graphene), where n is any integer number ≥1, and M is any metal in claim 2.

7. The method in claim 6, wherein the arene is an aromatic ligand, comprising a benzene or a derivative of benzene.

8. The method in claim 2, wherein the carbon material is graphene, and wherein the metal-carbon complex comprises at least one (graphene)-(metal atom)-(graphene) unit that electronically connects two-dimensional graphene sheets via the metal atom.

9. The method in claim 2, wherein the carbon material is a three-dimensional molecular wire, metal or superconductor, comprising two-dimensional graphene units that are electronically connected via an atom of the metal.

10. The method in claim 1, wherein the metal-carbon complex functions as an electronically conjugated reusable catalyst support.

11. The method in claim 1, wherein the method of modifying the carbon material further comprises a solution-phase, a solid-phase or a gas phase cross-linking method.

12. The method in claim 2, wherein the metal is covalently bonded to the carbon material by metal vapor synthesis.

13. The method in claim 2, wherein the metal is covalently bonded to the carbon by complexation reactions of carbon to various metal carbonyls, where the metal carbonyl is M(CO)$_3$L$_3$, wherein L is a ligand that is weaker than a CO ligand.

14. The method in claim 2, wherein the metal is covalently bonded to the carbon by room temperature complexation reactions of carbon to various metal carbonyls, where the metal carbonyl is M(CO)$_3$L$_3$, wherein L is a ligand that is weaker than a CO ligand.

15. The method in claim 13, wherein the ligand is selected from a group consisting of acetonitrile (CH$_3$CN), ammonia (NH$_3$), primary amine (RNH$_2$, where "R" could be any alkyl or aryl group).

16. The method of claim 2, further comprising using at least one reagent comprising a metal hexacarbonyl [M(CO)$_6$, wherein M is the metal], in presence of a foreign arene ligand, wherein the arene comprises naphthalene or a derivative of naphthalene.

17. The method of claim 1, wherein the de-complexation method comprises adding the modified carbon material including the metal-carbon complex to a solvent.

18. The method of claim 1, wherein the de-complexation method comprises exposing the carbon material and solvent to white light and air, or heating the metal-carbon complex in an electron-rich arene, wherein the carbon materials are returned to their unmodified state after the exposing or heating step.

19. The method of claim 17, wherein the solvent for the de-complexation method is selected from the group consisting of acetontrile, acetone and diethylether.

20. The method of claim 17, wherein the de-complexation method comprises competitive arene substitution reactions by an electron-rich aromatic ligand.

21. The method of claim 20, wherein the electron-rich ligand is selected from the group consisting benzene, toluene, mesitylene, hexamethylbenzene or a derivative of benzene.

22. The method of claim 17, wherein the de-complexation method further comprises use of iron, cerium or iodine as an oxidizing agent.

23. The method of claim 1, wherein bonding the metal to the carbon material further comprises intercalating metals by electron-beam deposition.

24. The method of claim 1, wherein modifying the carbon materials comprises increasing dimension of the electronic structure of the carbon material.

25. The method of claim 24, wherein the carbon material is a one-dimensional material and wherein modifying the carbon material comprises converting the one-dimensional material to a two-dimensional material or a three-dimensional material.

26. The method of claim 24, wherein the carbon material is a two-dimensional material and wherein modifying the carbon material comprises converting the two-dimensional material to a three-dimensional material.

27. The method of claim 1, wherein the metal is a Group 5 transition metal and wherein modifying the carbon material comprises forming an (arene)$_2$M or [(arene)M]$_x$, wherein M is V, Nb or Ta, wherein x≥1, wherein the arene is a benzenoid carbon material, and wherein bonding with the Group 5 transition metal causes the carbon-metal complex to be p-doped.

28. The method in claim 1, wherein the metal is a Group 6 transition metal, and wherein modifying the carbon material comprises forming a substantially neutral (arene)$_2$M or [(arene)M]$_x$, wherein M is Cr, Mo or W, x≥1, wherein the arene is a benzenoid carbon material, and wherein bonding with the Group 6 metal causes no charge transfer interactions.

29. The method in claim 1, wherein the metal is a Group 7 transition metal, and wherein modifying the carbon material comprises forming an (arene)$_2$M or [(arene)M]$_x$, wherein M is Mn, Tc or Re, x≥1, wherein the arene is a benzenoid carbon material, naphthalene or a derivative of naphthalene, and wherein bonding with the Group 7 metal causes the carbon-metal complex to be n-doped.

30. A modified carbon material formed by the method of claim 1.

31. A method of functionalizing a carbon material, the method comprising:
providing a suspension of the carbon material (CM) in a solvent; and
adding a metal carbonyl or a metal arene to the suspension to form an organometallic complex,
wherein the organometallic complex is selected from the group consisting of (CM)M(CO)$_3$, (CM)M(arene), (CM)M(CM), (arene)[M(CM)]$_n$(arene), [(CM)M]$_n$(CM), where n is an integer ≥1 and M is a metal.

32. The method of claim 31, wherein the metal is selected from the group consisting of scandium, yttrium, lanthanum, titanium, zirconium, hafnium, vanadium, niobium, tantalum, chromium, molybdenum, tungsten, manganese, technetium, rhenium, iron, ruthenium, osmium, praseodymium, neodymium, promethium, samarium, europium, gadolinium, terbium, dysprosium, holmium, erbium, thulium, ytterbium and lutetium.

33. The method of claim 31, wherein the metal is prepared from a source selected from the group consisting of titanium (0) heptacarbonyl [Ti(CO)$_7$], vanadium(0) hexacarbonyl [V(CO)$_6$], chromium(0) hexacarbonyl [Cr(CO)$_6$], molybdenum(0) hexacarbonyl [Mo(CO)$_6$], tungsten(0) hexacarbonyl [W(CO)$_6$], dimanganese(0) decacarbonyl [Mn$_2$(CO)$_{10}$], ditechnetium(0) decacarbonyl [Tc$_2$(CO)$_{10}$], dirhenium(0) decacarbonyl [Re$_2$(CO)$_{10}$], iron(0) pentacarbonyls [Fe(CO)$_5$], ruthenium(0) pentacarbonyls [Ru(CO)$_5$], osmium(0) pentacarbonyls [Os(CO)$_5$], [Co$_2$(CO)$_8$], [Co$_4$(CO)$_{12}$], tetrarhodium dodecacarbonyl [Rh$_4$(CO)$_{12}$], hexadecacarbonyl hexarhodium [Rh$_6$(CO)$_{16}$], [Ir$_4$(CO)$_{12}$], and nickel(0) tetracarbonyl [Ni(CO)$_4$].

34. The method of claim 31, wherein the metal carbonyl is selected from the group consisting of metal hexacarbonyl, M(CO)$_6$, (arene)metal tricarbonyl, (arene)M(CO)$_3$, bis(arene)metal, (arene)$_2$M, M(CO)$_3$L$_3$, wherein L is any non-carbonyl ligand weaker than carbonyl, wherein L comprises CH$_3$CN, NH$_3$ or RNH$_2$, wherein R is any alkyl or aryl group, and wherein the arene is benzene or a derivative of benzene, naphthalene or a derivative of naphthalene.

35. The method of claim 31, wherein the carbon material comprises exfoliated graphene comprising more than one graphene layer.

36. The method of claim 31, wherein the carbon material comprises graphite, and the solvent is selected from the group consisting of N,N-dimethylformamide (DMF), N-methylpyrrolidone (NMP), benzene, toluene, p-xylene, mono-chlorobenzene, ortho-dichlorobenzene, mono-fulorobenzene, benzylamine, a derivative of benzylamine, N-methylbenzylamine, N,N-dimetrhylbenzylamine, a perfluorinated aromatic solvent, octafluorotoluene, 1-butyl-3-methylimidazolium bis(trifluoromethane-sulfonyl)imide), tetrahydrofuran, dibutylether and any combination thereof.

37. The method of claim 31, wherein the solvent comprises an aromatic solvent capable of causing π-π stacking with graphene and of achieving concentration of graphene in solution ranging from 0.01 to 0.95 mg/mL.

38. The method of claim 31, wherein the solvent comprises an electron-deficient aromatic ligand.

39. The method of claim 31, wherein the solvent comprises a perfluorinated aromatic solvent.

40. The method of claim 31, further comprising preparing a stable solution from the suspension by ultrasonication and centrifugation, wherein the carbon material is graphene.

41. The method of claim 31, wherein the functionalized carbon material has a stoichiometry of MC$_x$, wherein M is the metal, C is carbon, and x is any number greater than or equal to zero.

42. A carbon-based material comprising:
a metal covalently bonded to carbon, wherein the metal binds two benzene units,
wherein the carbon material comprises extended sp$^2$-bonded carbon atoms wherein the metal is bonded to the carbon material by hexahapto bonding or bis-hexahapto bonding wherein conductive bridges are formed between single-walled nanotubes by intercalating metal atoms.

43. The carbon-based material of claim 42, comprising carbon nanotubes having a different ratio of semiconducting to metallic single-walled nanotubes and multi-wall nanotubes.

44. The carbon-based material of claim 42, further comprising a carbon-metal complex that has 18 electrons in the valence shell.

45. The carbon-based material of claim 42, further comprising a carbon-metal complex, with an electronic charge distribution of (arene)M$^{-1}$(arene$^{+1}$), or [(arene$^{+1}$)M$^{-1}$]$_x$, wherein M is V, Nb or Ta, x≥1, wherein the arene is p-doped, and wherein the arene is a benzenoid carbon material.

46. The carbon-based material of claim 42, further comprising a carbon-metal complex, with an electronic charge distribution of (arene)M$^{+1}$(arene$^{-1}$) or [(arene$^{-1}$)M$^{+1}$]$_x$, wherein M=Mn, Tc or Re, x≥1, wherein the arene is n-doped, and wherein the arene is a benzenoid carbon material.

47. The carbon-based material of claim 42, further comprising adjacent conductive planes of sp$^2$-bonded carbon atoms, wherein the metal functions as a conductive interconnect between the adjacent conductive planes.

48. The carbon-based material of claim 42, wherein the carbon-based material comprises adjacent conductive planes of sp$^2$-bonded carbon atoms, and wherein the metal functions as a conductive interconnect between the adjacent conductive planes.

49. An electronic device comprising the carbon-based material of claim 42.

50. The electronic device of claim 49, wherein the carbon-based material is an interconnect of a transistor.

51. The electronic device of claim 49, wherein the carbon-based material is a ferromagnetic semiconductor.

52. The electronic device of claim 49, wherein the carbon-based material is a superconductor.

* * * * *